US011043957B2

(12) United States Patent
Nakamoto

(10) Patent No.: US 11,043,957 B2
(45) Date of Patent: Jun. 22, 2021

(54) SAMPLING CIRCUIT AND ELECTRONIC EQUIPMENT

(71) Applicant: SONY SEMICONDUCTOR SOLUTIONS CORPORATION, Kanagawa (JP)

(72) Inventor: Eiichi Nakamoto, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/041,949

(22) PCT Filed: Dec. 19, 2018

(86) PCT No.: PCT/JP2018/046722
§ 371 (c)(1),
(2) Date: Sep. 25, 2020

(87) PCT Pub. No.: WO2019/193789
PCT Pub. Date: Oct. 10, 2019

(65) Prior Publication Data
US 2021/0091777 A1 Mar. 25, 2021

(30) Foreign Application Priority Data
Apr. 4, 2018 (JP) .............................. JP2018-072036

(51) Int. Cl.
*H03M 1/12* (2006.01)
*H03F 3/343* (2006.01)
(Continued)

(52) U.S. Cl.
CPC .............. *H03M 1/12* (2013.01); *H03F 3/343* (2013.01); *H03M 1/001* (2013.01); *H03M 1/06* (2013.01); *H03M 1/1009* (2013.01)

(58) Field of Classification Search
CPC ........ H03M 1/12; H03M 1/1009; H03M 1/06; H03M 1/001
(Continued)

(56) References Cited

U.S. PATENT DOCUMENTS 6,243,034 B1* 6/2001 Regier .................. H03M 1/145
341/155
2008/0316074 A1 12/2008 Chida
2016/0329881 A1 11/2016 Matsuno et al.

FOREIGN PATENT DOCUMENTS

JP    10-313221 A    11/1998
JP    2006-109059 A    4/2006
(Continued)

OTHER PUBLICATIONS

Kuwano Masahiko, "Operation principles of switched capacitor circuit unit", Transistor Technology, CQ Publishing Co., Ltd., Aug. 2004, pp. 268-269.
(Continued)

Primary Examiner — Joseph J Lauture
(74) Attorney, Agent, or Firm — Chip Law Group

(57) ABSTRACT

Signal quality is improved in a circuit for amplifying and sampling an analog signal. An input signal is input to one end of an input-side resistor. An operational amplifier amplifies the input signal, and outputs the input signal from an output terminal as an amplified signal. One end of a filter capacitor is connected to an input terminal of the operational amplifier. A predetermined frequency component of the input signal passes through the filter capacitor. A sampling capacitor imports the amplified signal during a predetermined sampling period, and holds the amplified signal during a predetermined hold period. A sampling switch connects the output terminal of the operational amplifier to one end of the sampling capacitor during the sampling period, and disconnects the output terminal of the opera-
(Continued)

tional amplifier from one end of the sampling capacitor during the hold period. A cutoff circuit disconnects the input-side resistor from one end of the filter capacitor during the sampling period, and connects the input-side resistor to one end of the filter capacitor during the hold period.

9 Claims, 14 Drawing Sheets

(51) Int. Cl.
    *H03M 1/00*          (2006.01)
    *H03M 1/06*          (2006.01)
    *H03M 1/10*          (2006.01)

(58) Field of Classification Search
    USPC .................. 341/155, 120, 118, 110, 126
    See application file for complete search history.

(56) References Cited

FOREIGN PATENT DOCUMENTS

| | | | |
|---|---|---|---|
| JP | 2015-154093 | A | 8/2015 |
| JP | 2016-213641 | A | 12/2016 |
| WO | 2006/038637 | A1 | 4/2006 |

OTHER PUBLICATIONS

International Search Report and Written Opinion of PCT Application No. PCT/JP2018/046722, dated Mar. 19, 2019, 07 pages of ISRWO.

* cited by examiner

SAMPLING CIRCUIT AND ELECTRONIC EQUIPMENT

CROSS REFERENCE TO RELATED APPLICATIONS

This application is a U.S. National Phase of International Patent Application No. PCT/JP2018/046722 filed on Dec. 19, 2018, which claims priority benefit of Japanese Patent Application No. JP 2018-072036 filed in the Japan Patent Office on Apr. 4, 2018. Each of the above-referenced applications is hereby incorporated herein by reference in its entirety.

TECHNICAL FIELD

The present technology relates to sampling circuits and electronic equipment. Specifically, the present invention relates to a sampling circuit and electronic equipment that sample an analog signal.

BACKGROUND ART

Sampling circuits for sampling an analog signal have been conventionally used in various pieces of equipment such as acoustic equipment and a pressure sensor. For example, a switched capacitor in a sampling circuit has been proposed. In the sampling circuit, a pair of switches are connected to one end of a sampling capacitor. The switches are alternately turned on and off (e.g., see Patent Document 1). Furthermore, in a case where an analog signal is weak, an operational amplifier to which a filter capacitor is connected in parallel may be disposed in the front stage of a switched capacitor in order to amplify the signal.

CITATION LIST

Non-Patent Document

Non-Patent Document 1: Kuwano Masahiko. "Operation principles of switched capacitor circuit unit". Transistor Technology. CQ Publishing Co., Ltd. August 2004. p. 268-269.

SUMMARY OF THE INVENTION

Problems to be Solved by the Invention

In the above-described traditional technique, an analog signal can be sampled and held by turning on and off a switch in synchronization with a sampling clock. In the configuration in which an operational amplifier is disposed, however, if the voltage of an output terminal of the operational amplifier fluctuates at the time of switching, the voltage fluctuation may fluctuate an amount of charge accumulated in a filter capacitor. The fluctuation in the amount of charge is not caused by fluctuation of an input signal. The waveform of an output signal from the operational amplifier thus deviates from the ideal waveform obtained by amplifying the input signal. Unfortunately, the deviation deteriorates the signal quality of the output signal.

The present technology has been made in view of such a situation, and an object thereof is to improve signal quality in a circuit that samples and amplifies an analog signal.

Solutions to Problems

The present technology is made to solve the above-described problem, and a first aspect is a sampling circuit including: an input-side resistor to one end of which an input signal is input; an operational amplifier that amplifies the input signal, and outputs the input signal from an output terminal as an amplified signal; a filter capacitor whose one end is connected to an input terminal of the operational amplifier, a predetermined frequency component of the input signal passing through the filter capacitor; a sampling capacitor that imports the amplified signal during a predetermined sampling period, and holds the amplified signal during a predetermined hold period; a sampling switch that connects the output terminal of the operational amplifier to one end of the sampling capacitor during the sampling period, and disconnects the output terminal of the operational amplifier from the one end of the sampling capacitor during the hold period; and a cutoff circuit that disconnects the input-side resistor from the one end of the filter capacitor during the sampling period, and connects the input-side resistor to the one end of the filter capacitor during the hold period. This brings about an effect that one end of the filter capacitor is disconnected during the sampling period, and the amount of charge is held.

Furthermore, in the first aspect, the input-side resistor may include a first input-side resistor and a second input-side resistor connected in series, one end of the second input-side resistor may be connected to the output terminal of the operational amplifier, the one end of the filter capacitor may be connected to an inverting input terminal of the operational amplifier, and another end may be connected to the output terminal of the operational amplifier, and the cutoff circuit may disconnect a connection point of the first input-side resistor and the second input-side resistor from the one end of the filter capacitor during the sampling period, and connect the connection point to the one end of the filter capacitor during the hold period. This brings about an effect that an input signal is inverted and amplified.

Furthermore, in the first aspect, a first output-side resistor and a second output-side resistor connected in series between the output terminal of the operational amplifier and a predetermined reference terminal may be provided, a connection point of the first output-side resistor and the second output-side resistor may be connected to an inverting input terminal of the operational amplifier, and the one end of the filter capacitor may be connected to a non-inverting input terminal of the operational amplifier. This brings about an effect that an input signal is amplified without inversion.

Furthermore, in the first aspect, the input-side resistor may include a first input-side resistor and a second input-side resistor connected in series, the filter capacitor may include: a first filter capacitor whose one end is connected to the non-inverting input terminal of the operational amplifier; and a second filter capacitor whose one end is connected to the output terminal of the operational amplifier, the cutoff circuit may include: a first cutoff switch that disconnects the input-side resistor from the one end of the first filter capacitor during the sampling period, and connects the input-side resistor to the one end of the first filter capacitor during the hold period; and a second cutoff switch that disconnects a connection point of the first input-side resistor and the second input-side resistor from another end of the second filter capacitor during the sampling period, and connects the connection point to the other end of the second filter capacitor during the hold period. This brings about an effect that one end of each of the first filter capacitor and the second filter capacitor is disconnected in the secondary low-pass filter.

Furthermore, a second aspect of the present technology is electronic equipment including: an input-side resistor to one end of which an input signal is input; an operational amplifier that amplifies the input signal, and outputs the input signal from an output terminal as an amplified signal; a filter capacitor whose one end is connected to an input terminal of the operational amplifier, a predetermined frequency component of the input signal passing through the filter capacitor; a sampling capacitor that imports the amplified signal during a predetermined sampling period, and holds the amplified signal during a predetermined hold period; a sampling switch that connects the output terminal of the operational amplifier to one end of the sampling capacitor during the sampling period, and disconnects the output terminal of the operational amplifier from the one end of the sampling capacitor during the hold period; a cutoff circuit that disconnects the input-side resistor from the one end of the filter capacitor during the sampling period, and connects the input-side resistor to the one end of the filter capacitor during the hold period; and a control unit that controls the sampling switch and the cutoff circuit. This brings about an effect that one end of the filter capacitor is disconnected during the sampling period, and the amount of charge is held under the control of the control unit.

Furthermore, in the second aspect, an integrator that integrates a difference between the amplified signal and a feedback signal, and outputs the difference as a signal to be quantized; a quantizer that quantizes the signal to be quantized, and outputs the signal as a digital signal; and a digital analog converter that converts the digital signal into an analog signal, and outputs the analog signal as the feedback signal may be further provided, the sampling switch may include: a first sampling switch that connects the output terminal to one end of the sampling capacitor during the sampling period, and disconnects the output terminal from the one end of the sampling capacitor during the hold period; and a second sampling switch that disconnects the digital analog converter from the one end of the sampling capacitor during the sampling period, and connects the digital analog converter to the one end of the sampling capacitor during the hold period, and the sampling capacitor may output the difference to the integrator. This brings about an effect that delta-sigma modulation is performed.

Furthermore, in the second aspect, a successive approximation control circuit that updates the feedback signal and generates a digital signal on the basis of a result of comparison between the amplified signal and a feedback signal; and a digital analog converter that generates and outputs the feedback signal under control of the successive approximation control circuit may be further provided, the sampling switch may include: a first sampling switch that connects the output terminal to one end of the sampling capacitor during the sampling period, and disconnects the output terminal from the one end of the sampling capacitor during the hold period; and a second sampling switch that disconnects the digital analog converter from the one end of the sampling capacitor during the sampling period, and connects the digital analog converter to the one end of the sampling capacitor during the hold period, and the sampling capacitor may output the result of comparison to the successive approximation control circuit. This brings about an effect that successive approximation control is performed.

Furthermore, in the second aspect, the control unit may supply a first sampling clock signal indicating either of the sampling period or the hold period to the sampling switch, and supply a signal obtained by inverting the first sampling clock signal to the cutoff circuit as a second sampling clock signal. This brings about an effect that switching is performed by the first sampling clock signal and the second sampling clock signal whose phases are opposite to each other.

Furthermore, in the second aspect, the control unit may output a first sampling clock signal indicating either the sampling period or the hold period to the sampling switch, and supply a signal, which indicates a period that does not overlap the sampling period as a period for disconnecting the input-side resistor, to the cutoff circuit as the second sampling clock signal. This brings about an effect that switching is performed by the first sampling clock signal and the second sampling clock signal whose phases do not overlap with each other.

Effects of the Invention

According to the present technology, an excellent effect that signal quality can be improved can be exhibited in a circuit that amplifies and samples an analog signal. Note that the effect described here is not necessarily limited, and either of the effects described in the present disclosure may be exhibited.

MODE FOR CARRYING OUT THE INVENTION

Embodiments for carrying out the present technology (hereinafter referred to as embodiments) will be described below. The description will be given in the following order.
1. First Embodiment (example in which one end of a filter capacitor is disconnected)
2. Second Embodiment (example in which one end of a filter capacitor is disconnected, and delta-sigma modulation is performed)
3. Third Embodiment (example in which one end of a filter capacitor is disconnected, and successive approximation control is performed)
4. Fourth Embodiment (example in which one end of a filter capacitor is disconnected, and amplification without inversion is performed)
5. Applications 1. First Embodiment

[Configuration Example of Electronic Equipment]

Figure 1:
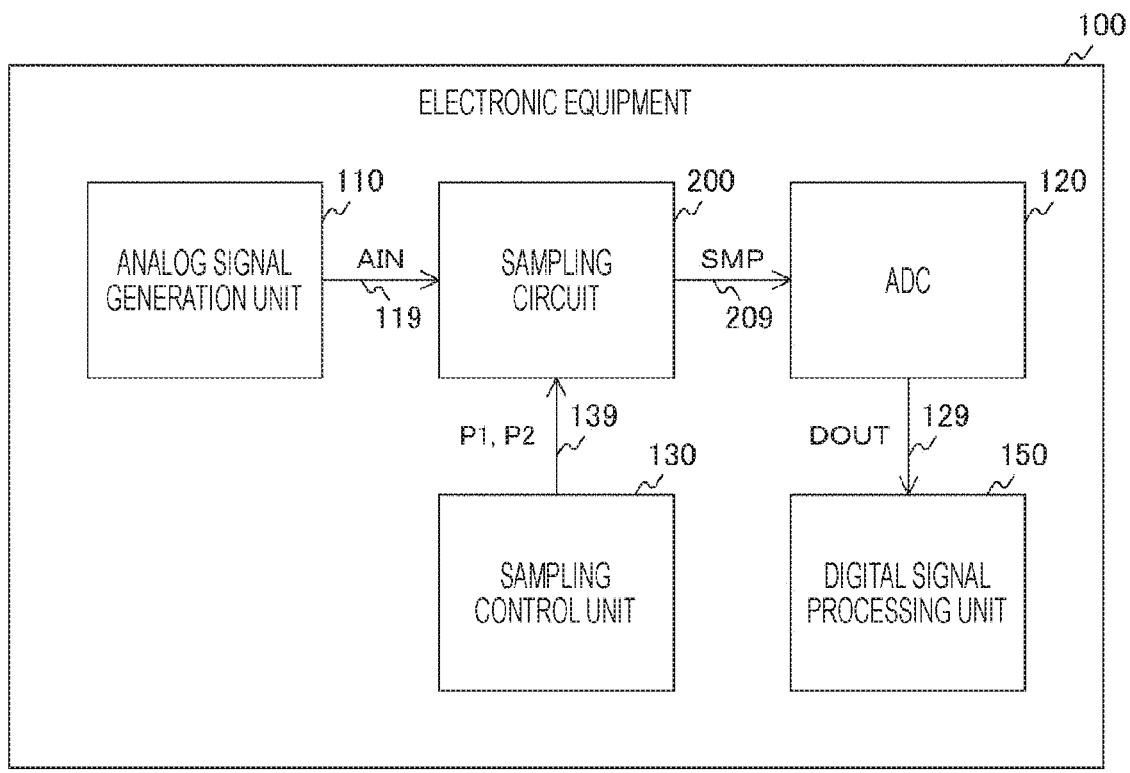
FIG. 1 is a block diagram illustrating one configuration example of electronic equipment in a first embodiment of the present technology.

FIG. 1 is a block diagram illustrating one configuration example of electronic equipment 100 in a first embodiment of the present technology. The electronic equipment 100 samples an analog signal, and includes an analog signal generation unit 110, a sampling circuit 200, an ADC 120, a sampling control unit 130, and a digital signal processing unit 150. Acoustic equipment and measuring equipment provided with a pressure sensor and a position sensor are assumed as the electronic equipment 100.

The analog signal generation unit 110 generates an analog voltage signal as an analog signal AIN. For example, a microphone that converts voice into an analog electric signal is assumed as the analog signal generation unit 110. The analog signal generation unit 110 supplies the generated analog signal AIN to the sampling circuit 200 via a signal line 119.

The sampling circuit 200 amplifies and samples the analog signal AIN in accordance with sampling clock signals P1 and P2. The sampling circuit 200 supplies the sampled analog signal to the ADC 120 as a sampling signal SMP via a signal line 209.

The ADC 120 converts the sampling signal SMP into a digital signal DOUT. The ADC 120 supplies the digital signal DOUT to the digital signal processing unit 150 via a signal line 129.

The sampling control unit 130 controls sampling timing of the sampling circuit 200. The sampling control unit 130 generates two clock signals having a phase different from each other by 180 degrees, and supplies the clock signals to the sampling circuit 200 as the sampling clock signals P1 and P2 via a signal line 139. Note that the sampling control unit 130 is one example of a control unit described in the claims.

The digital signal processing unit 150 executes predetermined signal processing on the digital signal DOUT. The digital signal processing unit 150 executes, for example, compression processing of compressing data and signal processing such as format conversion processing, as necessary.

[Configuration Example of Sampling Control Unit]

Figure 2:
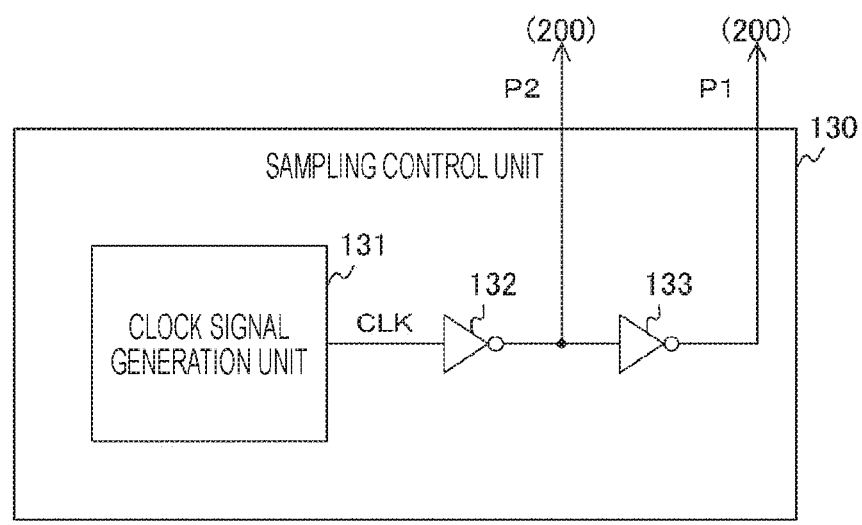
FIG. 2 is a block diagram illustrating one configuration example of a sampling control unit in the first embodiment of the present technology.

FIG. 2 is a block diagram illustrating one configuration example of the sampling control unit 130 in the first embodiment of the present technology. The sampling control unit 130 includes a clock signal generation unit 131 and inverters 132 and 133.

The clock signal generation unit 131 generates a clock signal CLK having a predetermined sampling frequency. The clock signal generation unit 131 supplies the clock signal CLK to the inverter 132.

The inverter 132 inverts the clock signal CLK. The inverter 132 supplies the inverted signals to the sampling circuit 200 and the inverter 133 as sampling clock signals P2.

The inverter 133 inverts the sampling clock signal P2. The inverter 133 supplies the inverted signal to the sampling circuit 200 as a sampling clock signal P1.

Figure 3:
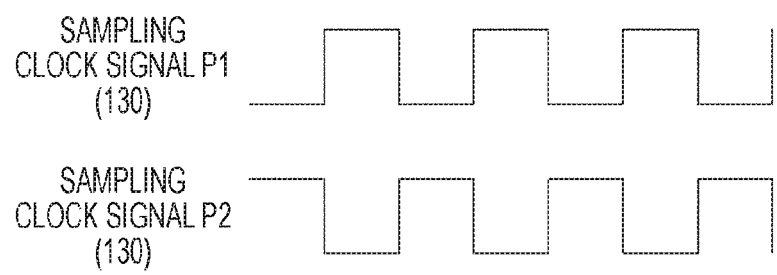
FIG. 3 illustrates examples of waveforms of sampling clock signals in the first embodiment of the present technology.

FIG. 3 illustrates examples of waveforms of the sampling clock signals P1 and P2 in the first embodiment of the present technology. As illustrated in the figure, the sampling clock signals P1 and P2 have a phase different from each other by 180 degrees. That is, the sampling clock signal P2 is at a low level during the period in which the sampling clock signal P1 is at a high level, and the sampling clock signal P2 is at a high level during the period in which the sampling clock signal P1 is at a low level.

[Configuration Example of Sampling Circuit]

Figure 4:
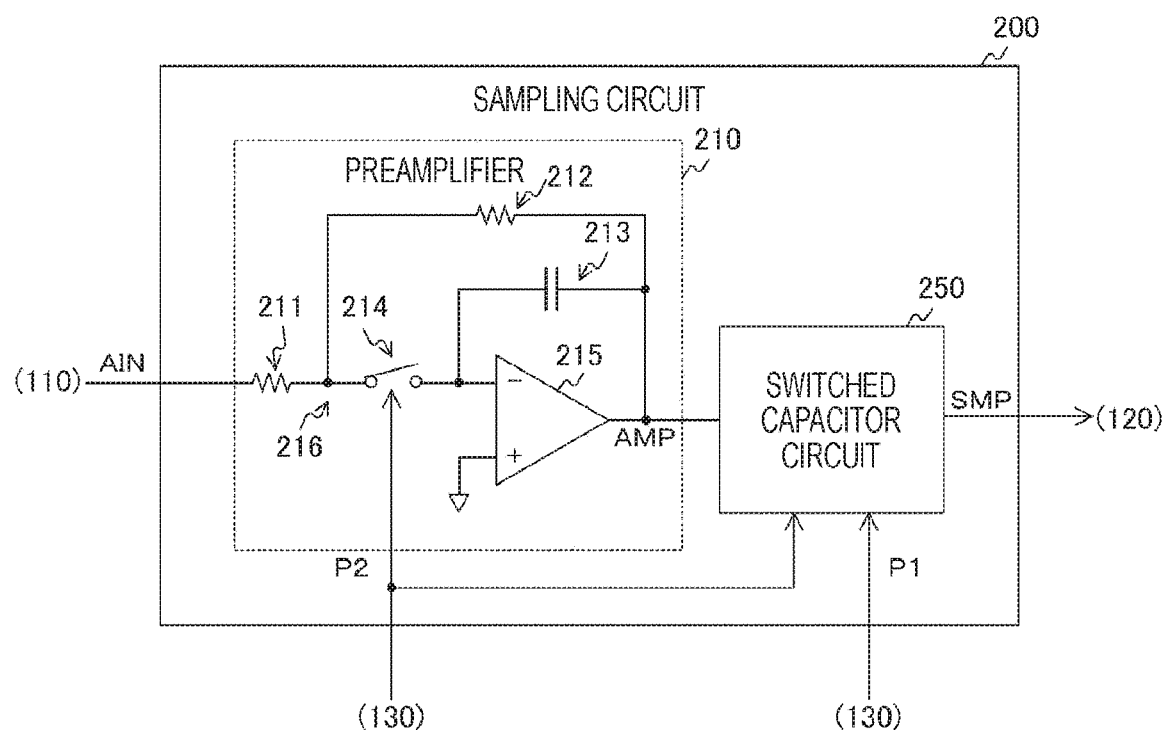
FIG. 4 is a circuit diagram illustrating one configuration example of a sampling circuit in the first embodiment of the present technology.

FIG. 4 is a circuit diagram illustrating one configuration example of the sampling circuit 200 in the first embodiment of the present technology. The sampling circuit 200 includes a preamplifier 210 and a switched capacitor circuit 250.

The preamplifier 210 inverts and amplifies the analog signal AIN (i.e., voltage signal). The preamplifier 210 includes resistors 211 and 212, a filter capacitor 213, a cutoff switch 214, and an operational amplifier 215.

The analog signal AIN from the analog signal generation unit 110 is input to one end of the resistor 211. Furthermore, the resistors 211 and 212 are connected in series between the analog signal generation unit 110 and an output terminal of the operational amplifier 215. Note that the resistor 211 is one example of a first input-side resistor described in the claims, and the resistor 212 is one example of a second input-side resistor described in the claims.

The filter capacitor 213 is a capacitor through which a predetermined frequency component of the analog signal AIN passes. Both ends of the filter capacitor 213 are connected to an inverting input terminal (−) of the operational amplifier 215 and the output terminal of the operational amplifier 215.

The cutoff switch 214 opens and closes a path between the connection point of the resistors 211 and 212 and the inverting input terminal (i.e., one end of the filter capacitor 213) of the operational amplifier 215 in accordance with the sampling clock signal P2. The cutoff switch 214 shifts to a closed state, for example, in a case where the sampling clock signal P2 is at a high level, and connects one end of the filter capacitor 213 to the connection point of the resistors 211 and 212. In contrast, in a case where the sampling clock signal P2 is at a low level, the cutoff switch 214 shifts to an open state, and disconnects one end of the filter capacitor 213 from the connection point of the resistors 211 and 212. Note that the cutoff switch 214 is one example of a cutoff circuit described in the claims.

The operational amplifier 215 inverts and amplifies a signal input to the inverting input terminal (−). A non-inverting input terminal (+) of the operational amplifier 215 is connected to a predetermined reference terminal (e.g., ground terminal).

The above-described connection configuration causes a circuit including the resistors 211 and 212 and the operational amplifier 215 to function as an inverting amplifier circuit that inverts and amplifies the analog signal AIN. The inverted and amplified signal is input to the switched capacitor circuit 250 as an amplified signal AMP. Here, gain A of the inverting amplifier circuit is expressed by the following expression.

$$A = -R_2/R_1$$

In the above expression, $R_1$ is the resistance value of the resistor 211, and $R_2$ is the resistance value of the resistor 212. The unit of these resistance values is, for example, ohm (Ω).

Furthermore, the circuit including the resistor 212 and the filter capacitor 213 functions as a low-pass filter through which a component below a predetermined cutoff frequency passes. The low-pass filter can reduce noise of the analog signal AIN. Here, a cutoff frequency fc is expressed by the following expression, for example.

$$Fc = 1/(2\pi R_2 C_f)$$

In the above expression, $C_f$ is the capacitance value of the filter capacitor 213, and the unit thereof is, for example, farad (F). The unit of the cutoff frequency fc is, for example, hertz (Hz).

In a case where the preamplifier 210 is used also as an anti-aliasing filter, the cutoff frequency fc is set to a value sufficiently lower than the sampling frequency of the sampling clock signal P1. Furthermore, the filter capacitor 213 also contributes to reduction of output impedance of the preamplifier 210 in a high frequency band. The preamplifier 210 can respond to a rapid voltage change in the output of the preamplifier 210 at high speed by bypassing the resistor 212 and feeding back the operational amplifier 215 via the filter capacitor 213.

[Configuration Example of Switched Capacitor]

Figure 5:
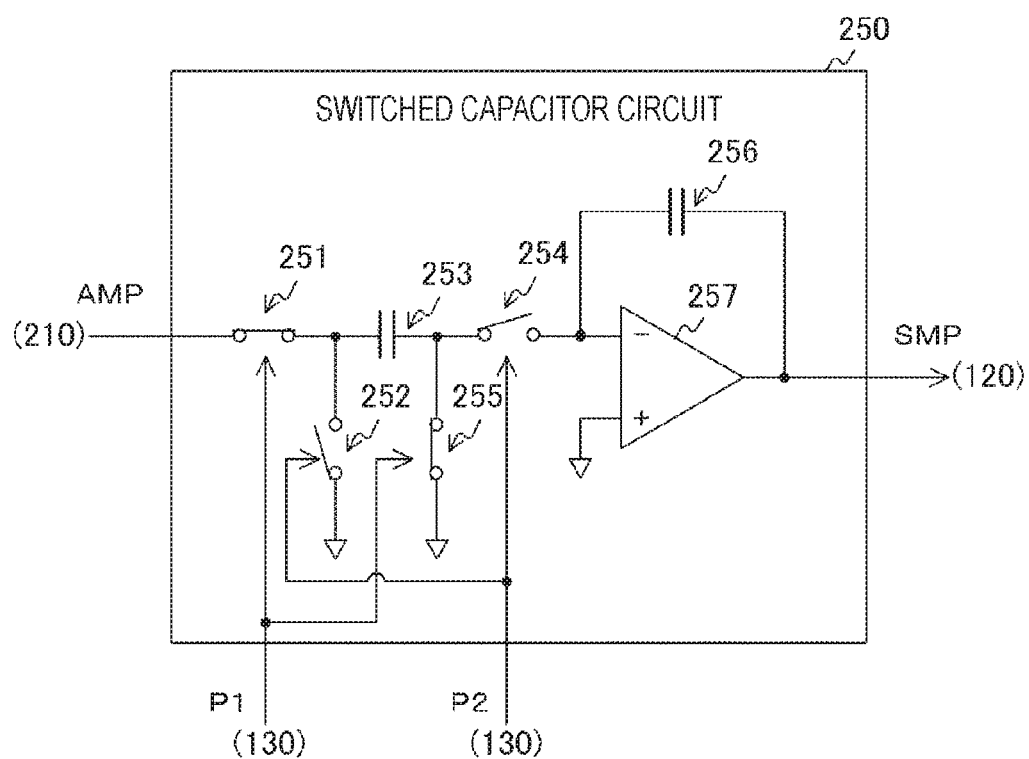
FIG. 5 is a circuit diagram illustrating one configuration example of a switched capacitor circuit in the first embodiment of the present technology.

FIG. 5 is a circuit diagram illustrating one configuration example of the switched capacitor circuit 250 in the first embodiment of the present technology. The switched capacitor circuit 250 includes sampling switches 251, 252, 254, and 255, a sampling capacitor 253, an operational amplifier 257, and a filter capacitor 256.

The sampling switch 251 opens and closes a path between one end of the sampling capacitor 253 on the input side and the preamplifier 210 in accordance with the sampling clock signal P1. The sampling switch 251 shifts to the closed state, for example, in a case where the sampling clock signal P1 is at a high level, and connects an output terminal of the preamplifier 210 to one end of the sampling capacitor 253. This causes the amplified signal AMP to be imported to the sampling capacitor 253. Hereinafter, a period in which the sampling clock signal P1 is at a high level will be referred to as a "sampling period".

In contrast, in a case where the sampling clock signal P1 is at a low level, the sampling switch 251 shifts to the open state, and disconnects an output terminal of the preamplifier 210 from one end of the sampling capacitor 253. This causes the sampled signal (amplified signal AMP) to be held in the sampling capacitor 253. Hereinafter, a period in which the sampling clock signal P1 is at a high level will be referred to as a "hold period".

The sampling switch 252 opens and closes a path between one end of the sampling capacitor 253 on the input side and a predetermined reference terminal (e.g., ground terminal) in accordance with the sampling clock signal P2. The sampling switch 252 shifts to the closed state, for example, in a case where the sampling clock signal P2 is at a high level, and connects one end of the sampling capacitor 253 to the reference terminal. In contrast, in a case where the sampling clock signal P2 is at a low level, the sampling switch 252 shifts to the open state, and disconnects one end of the sampling capacitor 253 from the reference terminal.

The sampling capacitor 253 imports the amplified signal AMP during the period in which the sampling clock signal P1 is at a high level (i.e., sampling period), and holds the amplified signal AMP during a low level period (i.e., hold period).

The sampling switch 254 opens and closes a path between one end of the sampling capacitor 253 on the output side and the inverting input terminal (−) of the operational amplifier 257 in accordance with the sampling clock signal P2. The sampling switch 254 shifts to the closed state, for example, in a case where the sampling clock signal P2 is at a high level, and connects one end of the sampling capacitor 253 to the inverting input terminal (−) of the operational amplifier 257. In contrast, in a case where the sampling clock signal P2 is at a low level, the sampling switch 254 shifts to the open state, and disconnects one end of the sampling capacitor 253 from the inverting input terminal (−).

The sampling switch 255 opens and closes a path between one end of the sampling capacitor 253 on the output side and the reference terminal in accordance with the sampling clock signal P1. The sampling switch 255 shifts to the closed state, for example, in a case where the sampling clock signal P1 is at a high level, and connects one end of the sampling capacitor 253 to the reference terminal. In contrast, in a case where the sampling clock signal P1 is at a low level, the sampling switch 255 shifts to the open state, and disconnects one end of the sampling capacitor 253 from the reference terminal.

The above-described connection configuration causes the circuit including the sampling switches 251, 252, 254, and 255 and the sampling capacitor 253 to function as a switched capacitor.

Furthermore, both ends of the filter capacitor 256 are connected to an inverting input terminal (−) and the output terminal of the operational amplifier 257.

The operational amplifier 257 inverts and amplifies a signal from the switched capacitor. The operational amplifier 257 supplies the inverted and amplified signal to the ADC 120 as the sampling signal SMP.

Here, if the sampling switch 251 is shifted to the closed state by the sampling clock signal P1 at a high level, the voltage of the output terminal of the operational amplifier 215 in the preamplifier 210 instantaneously drops. Such a phenomenon in which voltage fluctuates due to switching is called "kickback". The amount of fluctuation in the kickback will be hereinafter referred to as "kickback voltage".

Figure 6A:
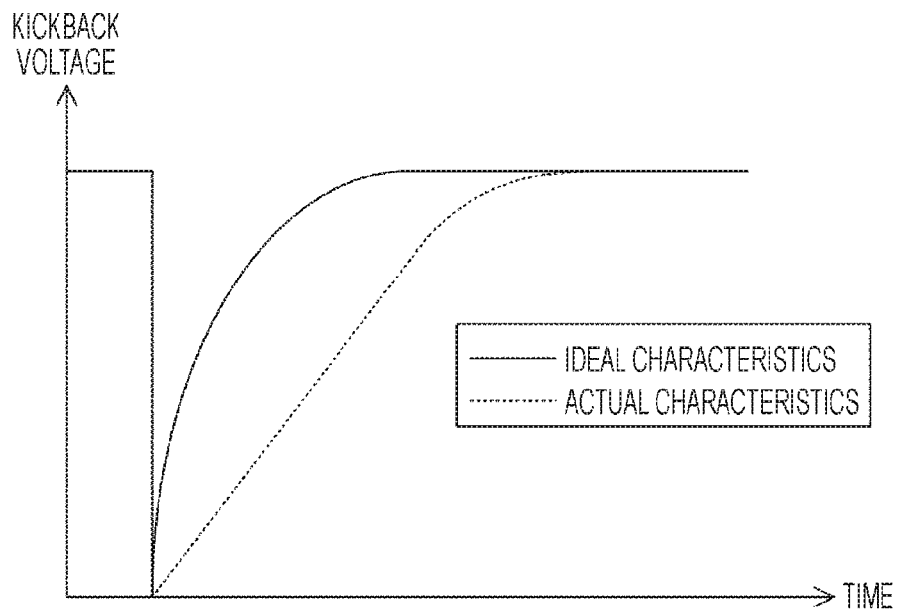
FIGS. 6A and 6B illustrate one example of waveforms of kickback voltage in the first embodiment of the present technology.
Figure 6B:
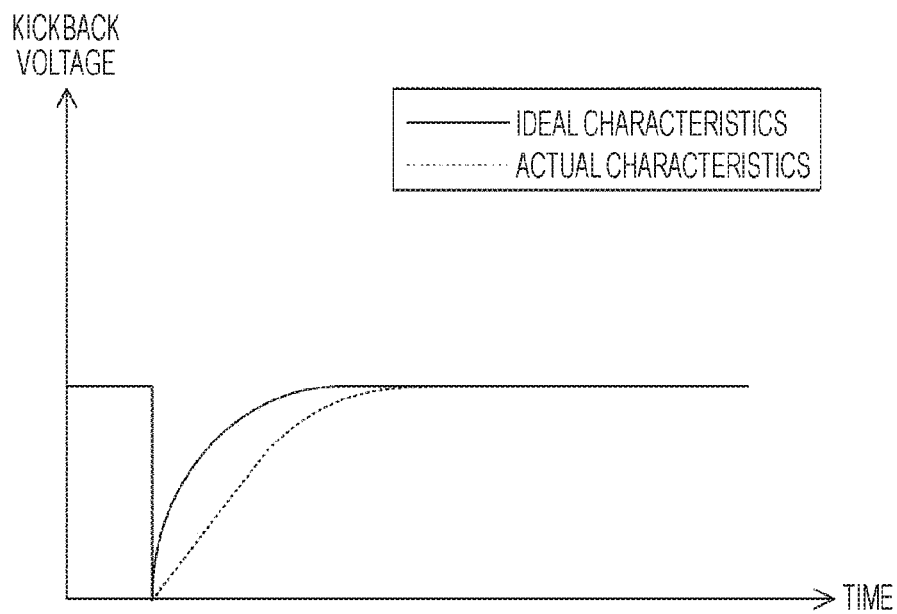

FIGS. 6A and 6B illustrate one example of waveforms of kickback voltage in the first embodiment of the present technology. The vertical axis in the figure represents the kickback voltage, and the horizontal axis represents time. One example of waveforms of kickback voltage at the time when voltage to be sampled (i.e., voltage of the amplified signal AMP) is higher than a predetermined value is illustrated by FIG. 6A. One example of waveforms of kickback voltage at the time when voltage to be sampled is lower than the predetermined value is illustrated by FIG. 6B. Also, a solid line indicates the characteristics of an ideal operational amplifier with no limitation on output current, and a solid line illustrates the characteristics of an actual operational amplifier with limitation on the output current.

As illustrated in the figure, voltage fluctuation is instantaneous in the ideal operational amplifier. For this reason, a slew rate, which is the operation speed of an operational amplifier (here, operational amplifier 215), is relatively fast, and the waveform of the output voltage of the operational amplifier is close to the waveform obtained by inverting and amplifying the input voltage of the operational amplifier. As a result, linearity is maintained. In contrast, since charge current of the sampling capacitor 253 is small in the actual operational amplifier with limitation on output current, it takes tame to transition voltage. For this reason, the slew rate of the operational amplifier (here, operational amplifier 215) is reduced, and the linearity cannot be maintained. In particular, the higher the voltage to be sampled is, the more noticeable the difference in characteristics between the ideal operational amplifier and the actual operational amplifier is. Note that the actual operational amplifier does not have a simple waveform as illustrated in the figure since the actual operational amplifier involves various non-linear operations in addition to those due to the current limitation.

Figure 7:
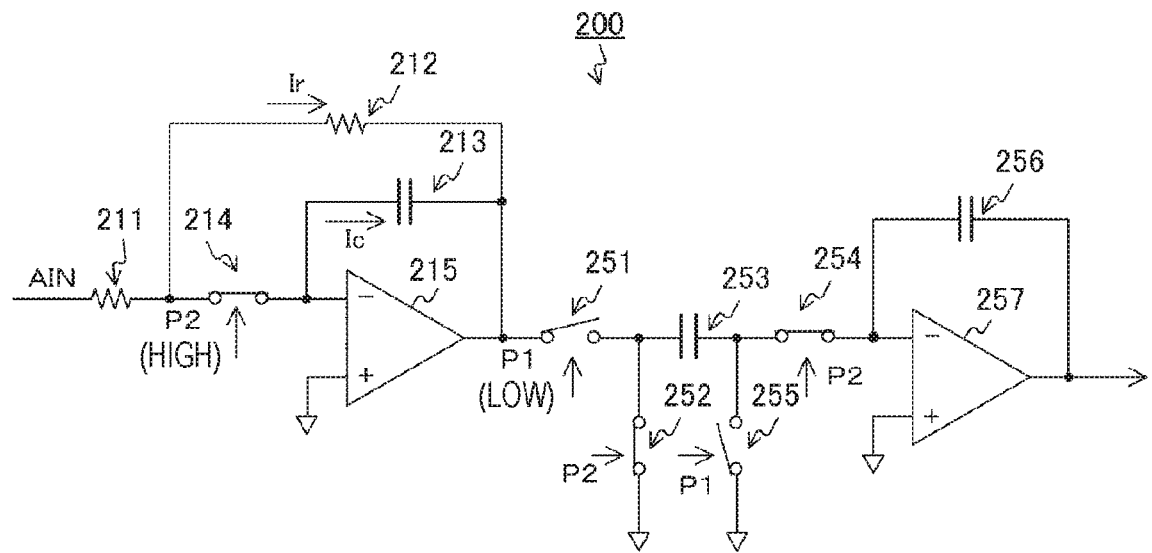
FIG. 7 is a circuit diagram illustrating one example of the state of the sampling circuit during a hold period in first embodiment of the present technology.

FIG. 7 is a circuit diagram illustrating one example of the state of the sampling circuit 200 during the hold period in first embodiment of the present technology. The sampling clock signal P2 is at a high level during the period in which the sampling clock signal P1 is at a low level (i.e., hold period). These signals causes the cutoff switch 214 and the sampling switches 252 and 254 to shift to the closed state, and causes the other switches to the open state. Then, the sampling capacitor 253 holds the amplified signal AMP obtained by inverting and amplifying the analog signal AIN (voltage signal).

Figure 8:
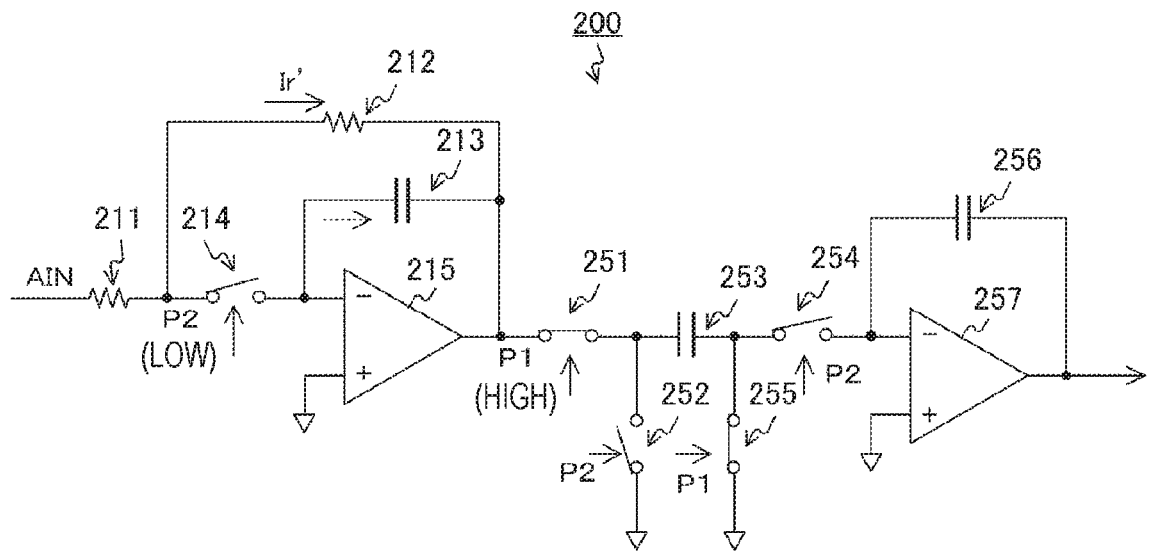
FIG. 8 is a circuit diagram illustrating one example of the state of the sampling circuit during a sampling period in the first embodiment of the present technology.

FIG. 8 is a circuit diagram illustrating one example of the state of the sampling circuit 200 during the sampling period in the first embodiment of the present technology. The arrows in the figure indicate the direction of current flow. The sampling clock signal P2 is at a high level during the period in which the sampling clock signal P1 is at a high level (i.e., sampling period). These signals cause the sampling switches 251 and 255 to shift to the closed state, and cause the other switches to the open state.

In a case where the sampling switch 251 shifts to the closed state, the kickback voltage is generated as described above. This causes the output voltage (i.e., response) with respect to the input voltage of the operational amplifier 215 to be non-linear.

Here, a comparative example is assumed. In the comparative example, the cutoff switch 214 is not provided, and one end of the filter capacitor 213 is directly connected to the connection point of the resistors 211 and 212. In the comparative example, in a case where kickback voltage is generated, the kickback voltage fluctuates current flowing through each of the resistor 212 and the filter capacitor 213. The current fluctuation slightly fluctuates an amount of charge accumulated in the filter capacitor 213. Then, the fluctuation amount is accumulated as the sampling is repeated. The accumulated fluctuation amount is not caused by the fluctuation of the analog signal AIN. For this reason, the waveform of an output signal (amplified signal AMP) of the preamplifier 210 is distorted compared to an ideal waveform obtained by inverting and amplifying an input signal (analog signal AIN), and the signal quality of the output signal is deteriorated.

Noted that, although, if the filter capacitor 213 is reduced, it is not necessary to consider the influence of the kickback voltage, the low-pass filter cannot be achieved without the filter capacitor 213. Reduction of the filter capacitor 213 is thus not preferable.

In contrast, in the sampling circuit 200 provided with the cutoff switch 214, the cutoff switch 214 shifts to the open state during the hold period in which the kickback voltage is generated. As a result, no current flows through the filter capacitor 213, and charge in the filter capacitor 213 can be trapped. This can prevent the response of the preamplifier 210 from becoming non-linear due to the kickback voltage, and improve the signal quality of an output signal.

Furthermore, the arrangement of the cutoff switch 214 also has an effect that the input resistance value of the preamplifier 210 is not changed by switch operation. Even in the case where the cutoff switch 214 is in the open state, the resistors 211 and 212 maintain direct current, so that the resistance value seen from the input terminal of the preamplifier 210 is apparently unchanged from the resistor 211.

Furthermore, a side effect that the cutoff frequency fc of the low-pass filter shifts to a lower frequency band is generated by the cutoff switch 214 being periodically in the open state. This is because no current flows through the filter capacitor 213 while the cutoff switch 214 is in the open state, and the capacitance appears to be increased in terms of direct equivalent.

In this way, according to the first embodiment of the present technology, the cutoff switch 214 disconnects one end of the filter capacitor 213 during the hold period, so that the current does not flow through the filter capacitor 213 even if voltage fluctuates at the time of switching. This can prevent the amount of charge accumulated in the filter capacitor 213 from fluctuating due to the voltage fluctuation, and improve the signal quality.

[Variation]

In the above-described first embodiment, the signal obtained by inverting the sampling clock signal P1 is used as the sampling clock signal P2. In the configuration, there is a possibility that a period, in which the sampling clock signal P2 does not transition to the low level, is generated due to, for example, signal delay in spite of the fact that the sampling clock signal P1 has transitioned to the high level. During the period, the kickback voltage reduces the signal quality. The electronic equipment 100 in the variation of the second embodiment is different from that in the first embodiment in that the sampling clock signals P1 and P2, whose high-level periods do not overlap, are generated.

Figure 9:
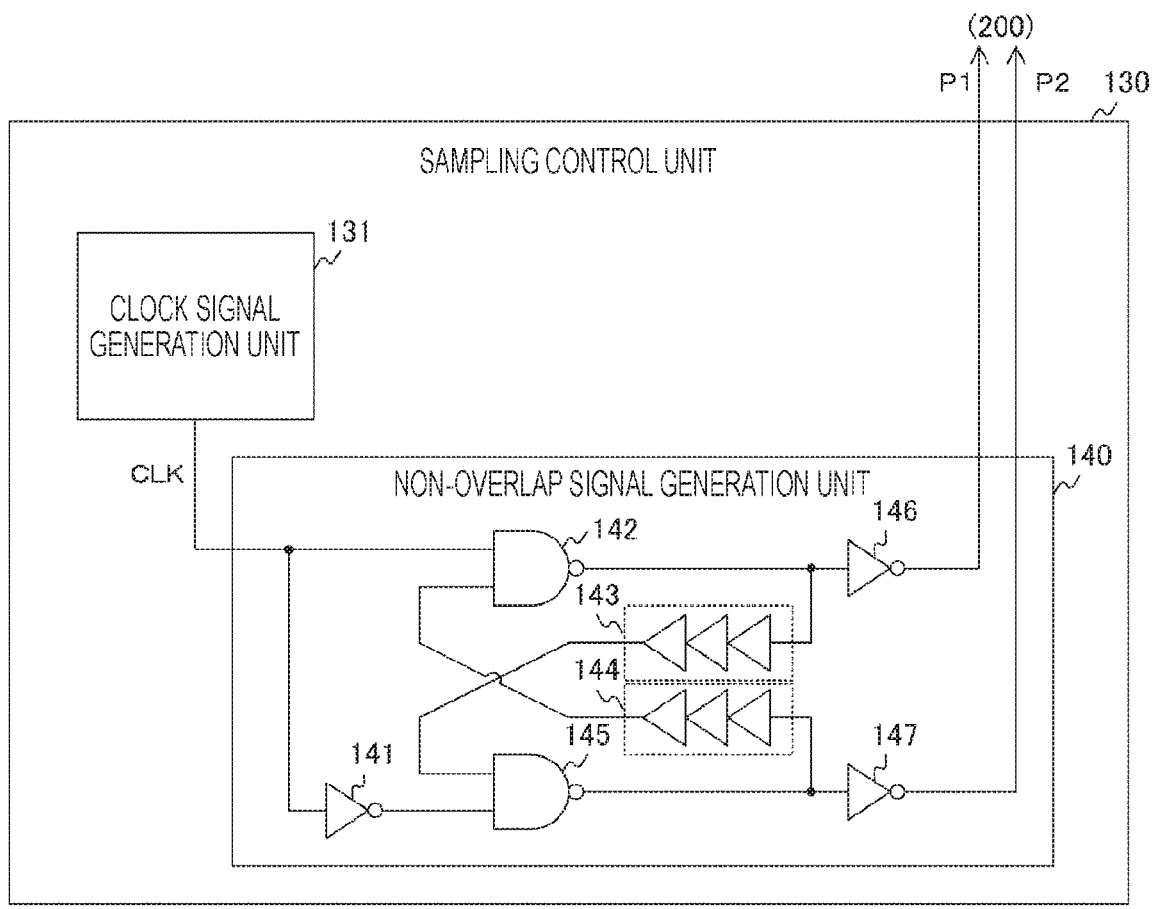
FIG. 9 is a block diagram illustrating one configuration example of a sampling control unit in a variation of the first embodiment of the present technology.

FIG. 9 is a block diagram illustrating one configuration example of the sampling control unit 130 in a variation of the first embodiment of the present technology. The sampling control unit 130 in the variation of the first embodiment is different from that in the first embodiment in that a non-overlap signal generation unit 140 is provided instead of the inverters 132 and 133.

The non-overlap signal generation unit 140 generates the sampling clock signals P1 and P2 whose high-level periods do not overlap with each other. The non-overlap signal generation unit 140 includes inverters 141, 146, and 147, negative AND (NAND) gates 142 and 145, and delay circuits 143 and 144.

The inverter 141 inverts the clock signal CLK to generate an inverted signal, and supplies the inverted signal to the NAND gate 145.

The NAND gate 142 outputs the negative AND of a delay signal from the delay circuit 144 and the clock signal CLK to the inverter 146 and the delay circuit 143. The NAND gate 145 outputs the negative AND of a delay signal from the delay circuit 143 and an inverted signal from the inverter 141 to the inverter 147 and the delay circuit 144.

The delay circuit 143 delays a signal from the NAND gate 142, and supplies the signal to the NAND gate 145 as a delay signal. The delay circuit 144 delays a signal from the NAND gate 145, and supplies the signal to the NAND gate 142 as a delay signal.

The inverter 146 inverts a signal from the NAND gate 142, and supplies the signal to the sampling circuit 200 as the sampling clock signal P1. The inverter 147 inverts a signal from the NAND gate 145, and supplies the signal to the sampling circuit 200 as the sampling clock signal P2.

Figure 10:
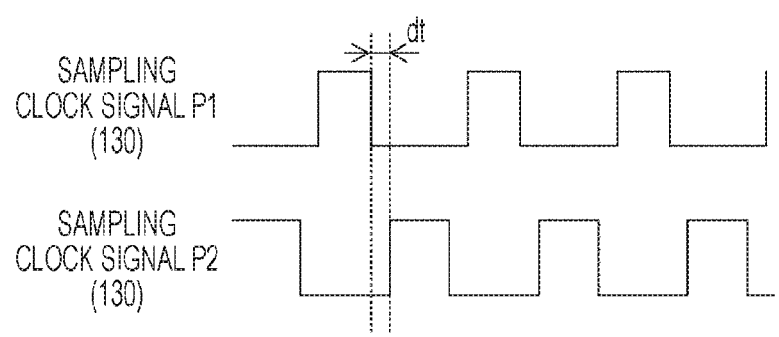
FIG. 10 illustrates examples of waveforms of sampling clock signals in the variation of the first embodiment of the present technology.

FIG. 10 illustrates examples of waveforms of the sampling clock signals P1 and P2 in the variation of the first embodiment of the present technology. As illustrated in the figure, for example, the sampling clock signal P2 rises after dt has elapsed since the sampling clock signal P1 fell.

In this way, the high-level period (i.e., sampling period) of the sampling clock signal P1 and the high-level period (i.e., period in which the cutoff switch 214 is in the closed state) of the sampling clock signal P2 do not overlap. Therefore, it is possible to prevent the cutoff switch 214 from being in the closed state in spite of the sampling period.

In this way, according to the variation of the first embodiment of the present technology, the sampling control unit 130 generates the two clock signals P1 and P2 that do not overlap with each other, so that it is possible to prevent the cutoff switch 214 from being in the closed state during the sampling period. As a result, deterioration of signal quality due to kickback voltage can be reliably inhibited.

2. Second Embodiment

Although the ADC 140 is disposed outside the switched capacitor circuit 250 in the above-described first embodiment, the circuit scale of the electronic equipment 100 can be reduced by using the switched capacitor circuit as an adder in the ADC. Electronic equipment 100 of the second embodiment is different from that in the first embodiment in that the switched capacitor circuit is used as an adder in an ADC.

Figure 11:
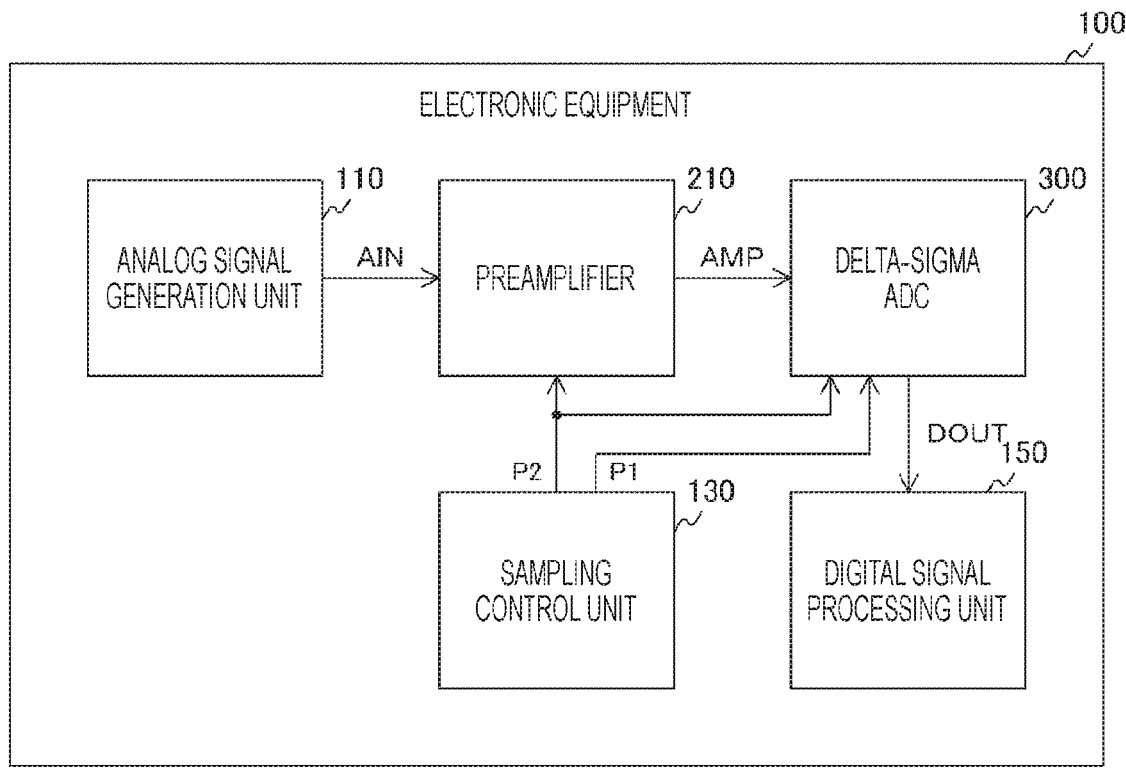
FIG. 11 is a block diagram illustrating one configuration example of electronic equipment in a second embodiment of the present technology.

FIG. 11 is a block diagram illustrating one configuration example of the electronic equipment 100 in the second embodiment of the present technology. The electronic equipment 100 of the second embodiment is different from that in the first embodiment in that a preamplifier 210 and a delta-sigma ADC 300 are provided instead of the sampling circuit 200 and the ADC 120.

The preamplifier 210 of the second embodiment supplies an amplified signal AMP to the delta-sigma ADC 300. The delta-sigma ADC 300 converts the amplified signal AMP into a digital signal DOUT, and supplies the digital signal DOUT to the digital signal processing unit 150.

Figure 12:
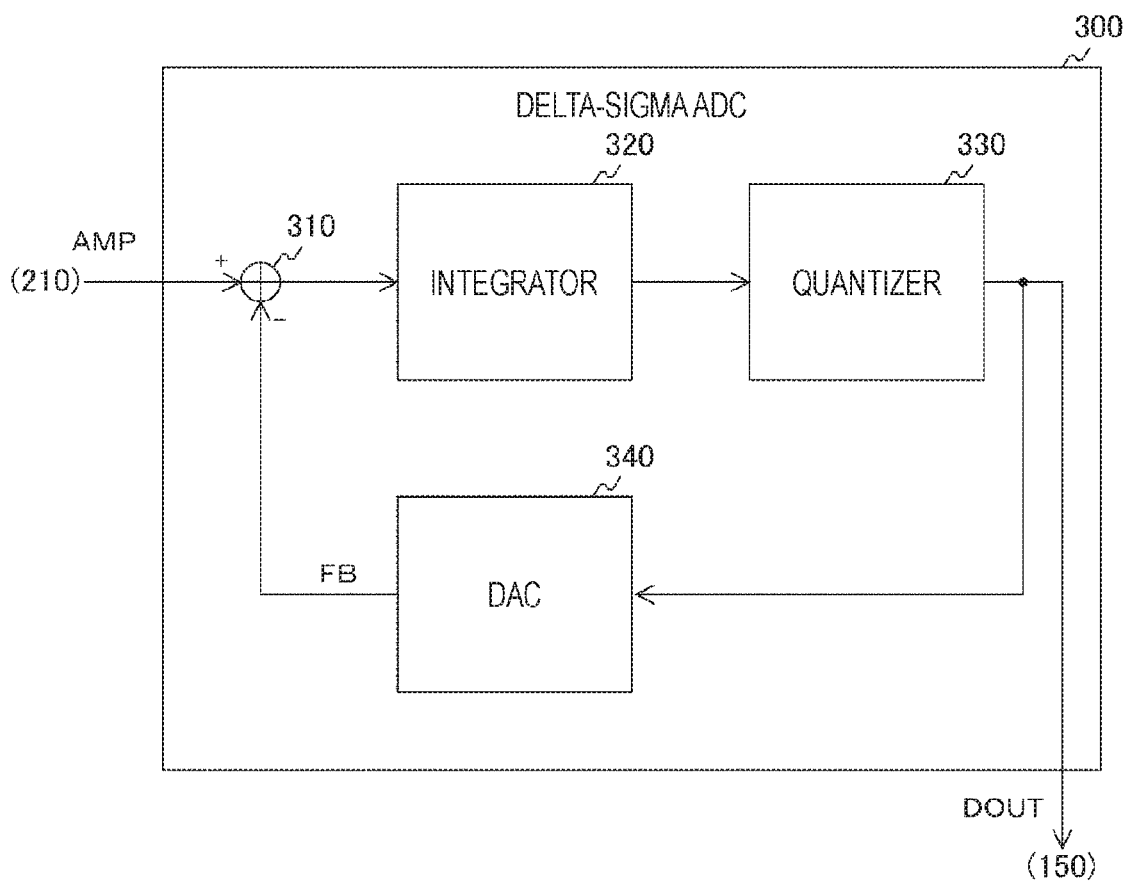
FIG. 12 is a block diagram illustrating one configuration example of a delta-sigma analog to digital converter (ADC) in the second embodiment of the present technology.

FIG. 12 is a block diagram illustrating one configuration example of the delta-sigma ADC 300 in the second embodiment of the present technology. The delta-sigma ADC 300 includes an adder 310, an integrator 320, a quantizer 330, and a digital to analog converter (DAC) 340.

The adder 310 determines the difference between the amplified signal AMP from the preamplifier 210 and a feedback signal FB from the DAC 340, and supplies the difference to the integrator 320. The integrator 320 integrates the difference from the adder 310, and supplies the difference to the quantizer 330 as a signal to be quantized.

The quantizer 330 quantizes the signal to be quantized from the integrator 320, and supplies the signal to be quantized to the digital signal processing unit 150 and the DAC 340 as a digital signal DOUT.

The DAC 340 converts the digital signal DOUT into an analog signal, and feeds the analog signal back to the adder 310 as the feedback signal FB.

With the above-described configuration, the analog amplified signal AMP is converted to the digital signal DOUT by delta-sigma modulation.

Figure 13:
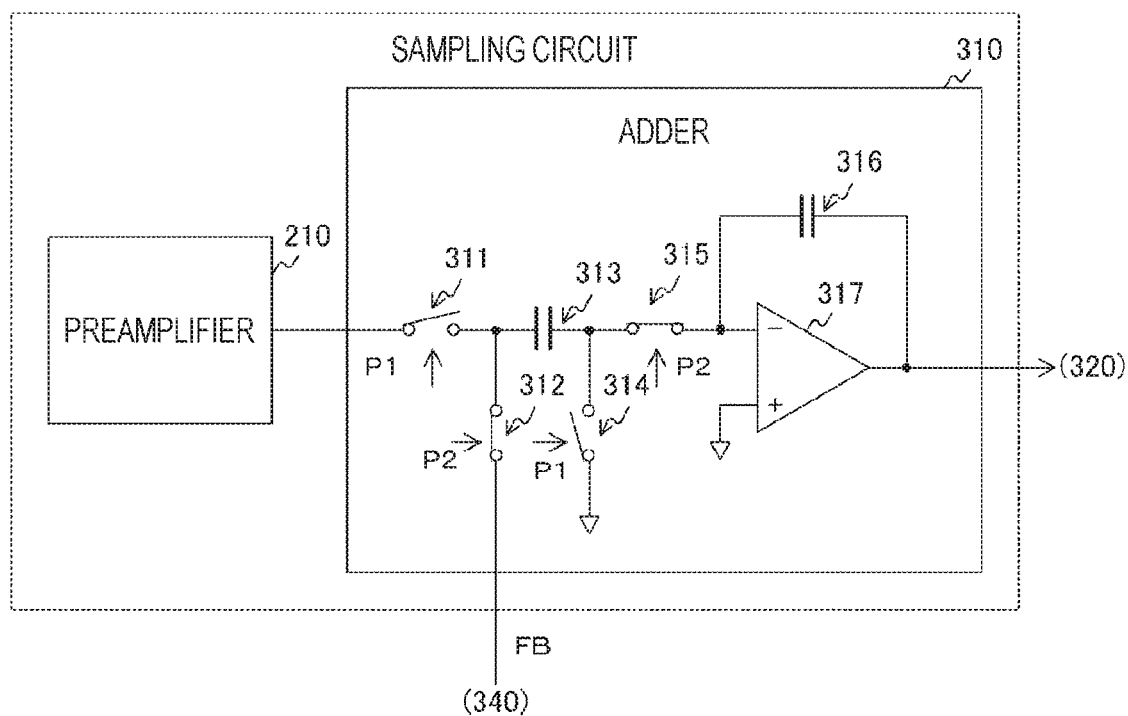
FIG. 13 is a circuit diagram illustrating one configuration example of a sampling circuit in the second embodiment of the present technology.

FIG. 13 is a circuit diagram illustrating one configuration example of a sampling circuit in the second embodiment of the present technology. The adder 310 of the second embodiment includes sampling switches 311, 312, 314, and 315, a sampling capacitor 313, a filter capacitor 316, and an operational amplifier 317. The connection configuration of the circuit thereof is similar to that of the switched capacitor circuit 250 of the first embodiment. The sampling switch 312 opens and closes the path between one end of the sampling capacitor 313 and the output of the DAC 340.

The above-described connection configuration causes the sampling capacitor 313 to be charged by voltage of the amplified signal AMP during the sampling period, and to be charged by voltage of the feedback signal FB during the hold period. Then, a charge amount in accordance with the difference therebetween is accumulated in the filter capacitor 316. In this way, the adder 310 (i.e., switched capacitor circuit) functions as a circuit for determining the difference between the amplified signal AMP and the feedback signal FB.

Note that the circuit including the preamplifier 210 and the adder 310 is one example of the sampling circuit described in the claims. Furthermore, the sampling switch 311 is one example of a first sampling switch described in the claims, and the sampling switch 312 is one example of a second sampling switch described in the claims.

At the time of transition from the hold period to the sampling period, charge caused by the difference between the amplified signal AMP and the feedback signal FB is supplied. At this time, non-linear kickback voltage is generated. If current in accordance with the kickback voltage flows through the filter capacitor 213 of the preamplifier 210, the distortion performance deteriorates. Moreover, in the delta-sigma ADC 300, the difference is due to high-frequency quantization noise, so that the kickback voltage may cause downsampling of the quantization noise, and increase floor noise. In contrast, in the preamplifier 210, the cutoff switch 214 disconnects one end of the filter capacitor 213 during the sampling period, so that adverse effects thereof can be reduced, and distortion performance and noise resistance performance can be improved.

Note that, in the second embodiment, the sampling control unit 130 can generate the sampling clock signals P1 and P2 whose high-level periods do not overlap as in the variation.

In this way, according to the second embodiment of the present technology, the switched capacitor circuit determines the difference between the amplified signal AMP and the feedback signal FB in the ADC, so that the circuit scale can be reduced compared to the configuration in which the switched capacitor circuit is disposed outside the ADC.

3. Third Embodiment

Although the ADC 120 is disposed outside the switched capacitor circuit 250 in the above-described first embodiment, the circuit scale of the electronic equipment 100 can be reduced by using the switched capacitor circuit as a comparator in the ADC. Electronic equipment 100 of a third embodiment is different from that in the first embodiment in that the switched capacitor circuit is used as a comparator in an ADC.

Figure 14:
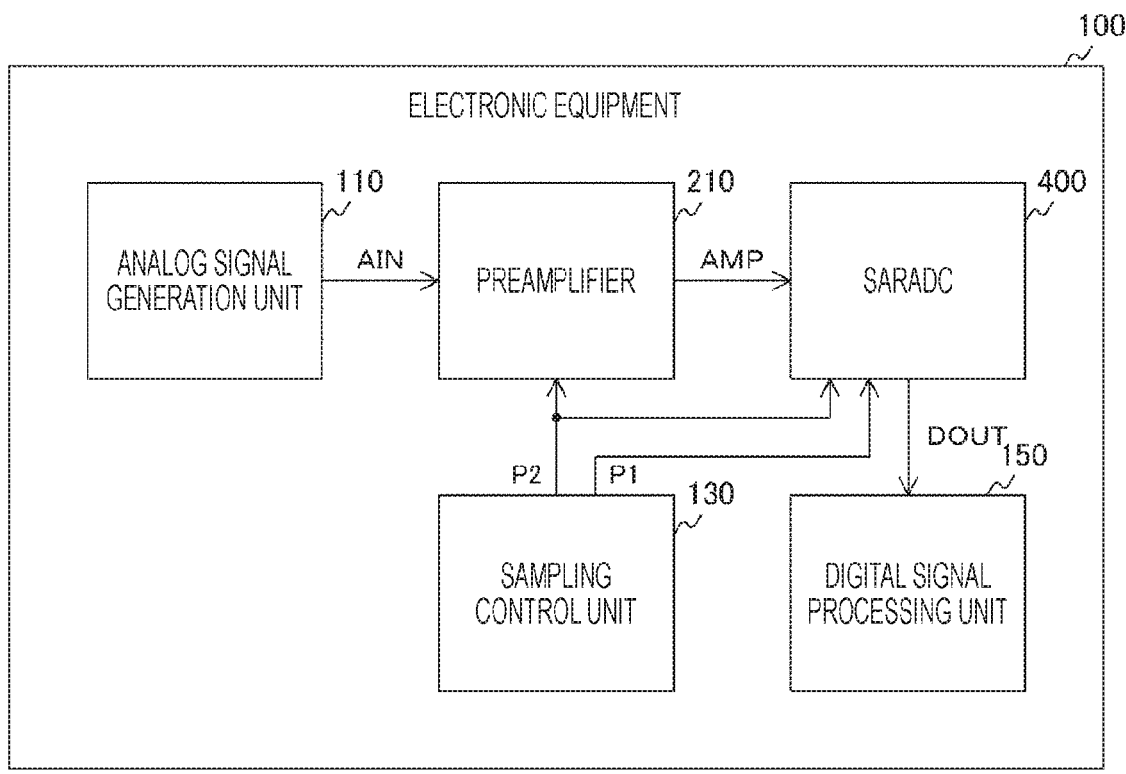
FIG. 14 is a block diagram illustrating one configuration example of electronic equipment in a third embodiment of the present technology.

FIG. 14 is a block diagram illustrating one configuration example of the electronic equipment 100 in the third embodiment of the present technology. The electronic equipment 100 of the third embodiment is different from that in the first embodiment in that a preamplifier 210 and a SAR ADC 400 are provided instead of the sampling circuit 200 and the ADC 120.

The preamplifier 210 of the third embodiment supplies an amplified signal AMP to the SAR ADC 400. The SAR ADC 400 converts the amplified signal AMP into a digital signal DOUT, and supplies the digital signal DOUT to the digital signal processing unit 150.

Figure 15:
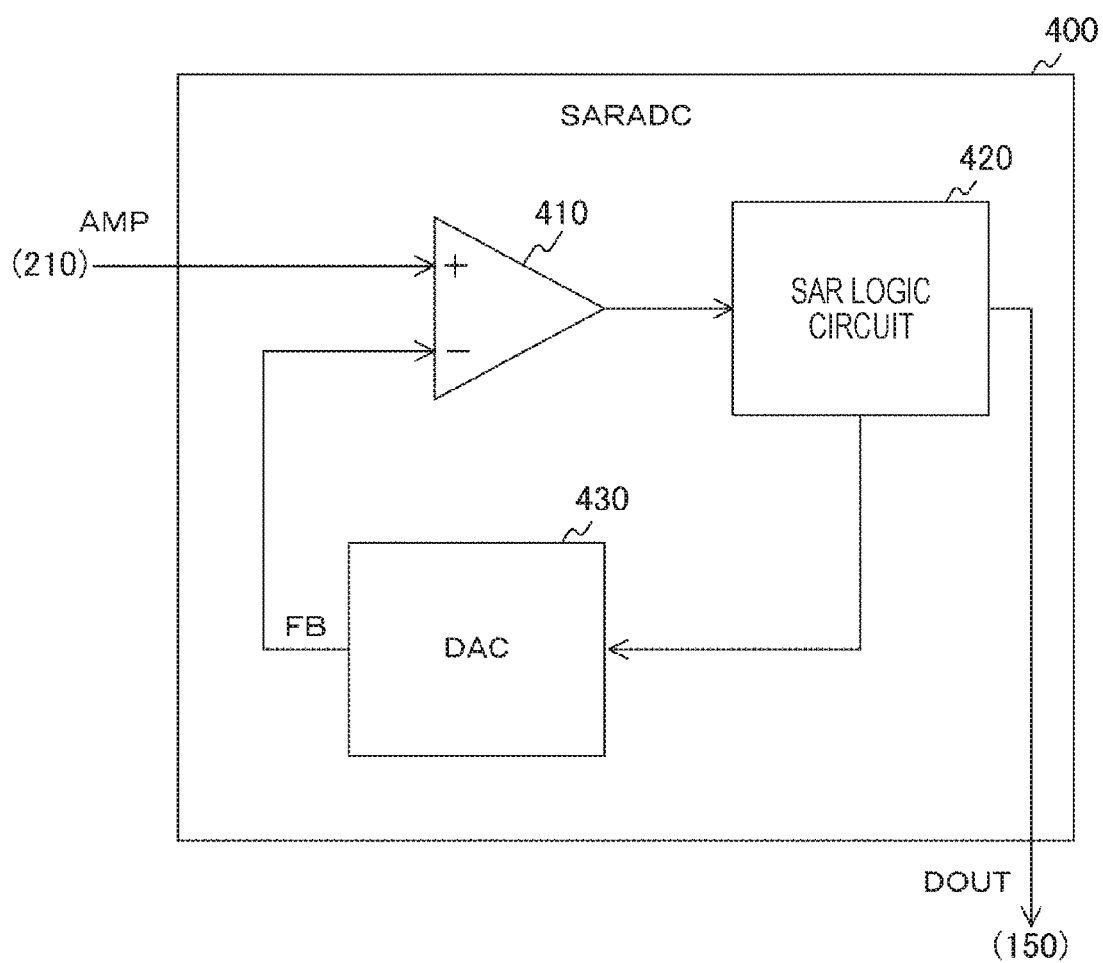
FIG. 15 is a block diagram illustrating one configuration example of a successive approximation register ADC (SAR ADC) in the third embodiment of the present technology.

FIG. 15 is a block diagram illustrating one configuration example of the SAR ADC 400 in the third embodiment of the present technology. The SAR ADC 400 includes a comparator 410, a SAR logic circuit 420, and a DAC 430.

The comparator 410 compares the amplified signal AMP from the preamplifier 210 and a feedback signal FB from the DAC 430. The comparator 410 supplies the comparison result to the SAR logic circuit 420.

The SAR logic circuit 420 updates the feedback signal FB under successive approximation control on the basis of the comparison result from the comparator 410, and generates a digital signal DOUT.

In the initial state of the successive approximation control, the level of the feedback signal FB is set to, for example, an initial value $V_{REF}/2$ defining a predetermined reference voltage as $V_{REF}$. Then, the comparator 410 compares the amplified signal AMP and a feedback signal FB at the initial value. In a case where the amplified signal AMP is larger than the feedback signal FB, the SAR logic circuit 420 sets the most significant bit (MSB) of the digital signal DOUT to "1". Then, the SAR logic circuit 420 controls the DAC 430 to raise the feedback signal FB by $V_{REF}/4$.

In contrast, in a case where the amplified signal AMP is equal to or lower than the feedback signal FB, the SAR logic circuit 420 sets the MSB of the digital signal DOUT to "0". Then, the SAR logic circuit 420 drops the feedback signal FB by $V_{REF}/4$.

Then, the comparator 410 performs the next comparison. In a case where the amplified signal AMP is larger than the feedback signal FB, the SAR logic circuit 420 sets the next digit of the MSB to "1". Then, the SAR logic circuit 420 raises the feedback signal FB by $V_{REF}/8$.

In contrast, in a case where the amplified signal AMP is equal to or lower than the feedback signal FB, the SAR logic circuit 420 sets the next digit of the MSB to "0". Then, the SAR logic circuit 420 drops the feedback signal FB by $V_{REF}/8$.

Hereinafter, a similar procedure is continued until the Least Significant Bit (LSB). This causes the analog amplified signal AMP to be subject to AD conversion into the digital signal DOUT. At the end of AD conversion, the SAR logic circuit 420 outputs the digital signal DOUT to the digital signal processing unit 150.

Figure 16:
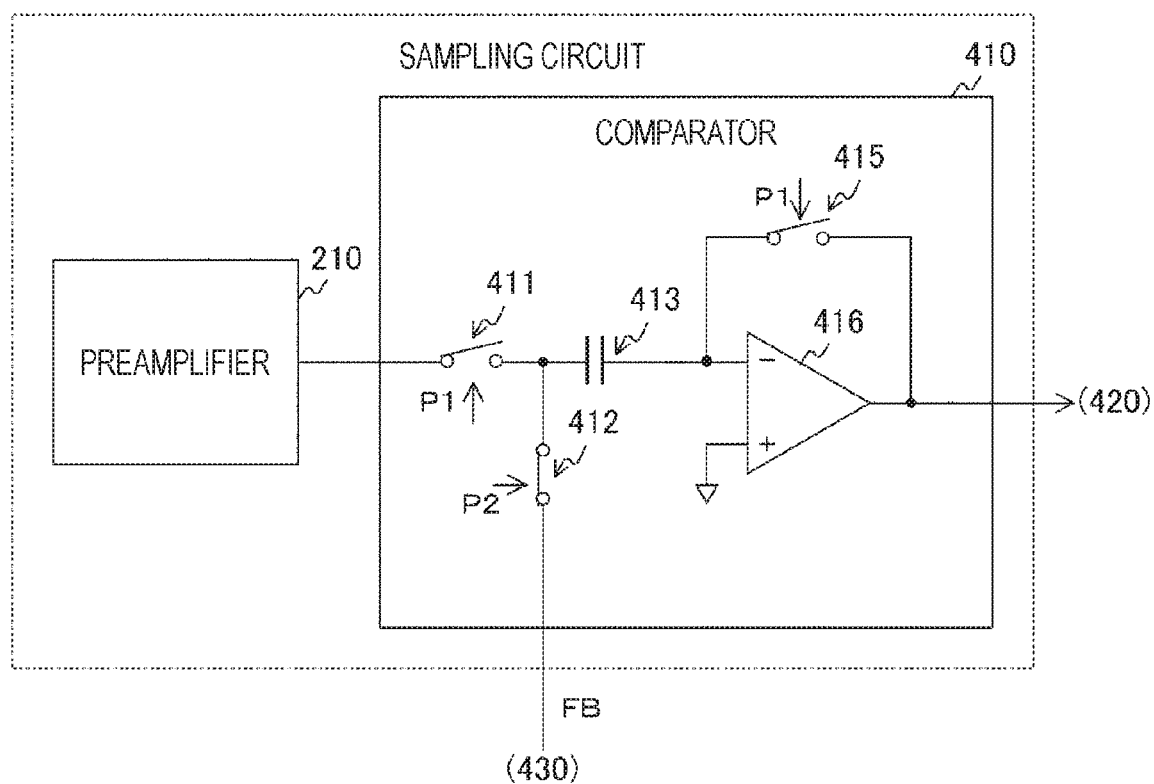
FIG. 16 is a circuit diagram illustrating one configuration example of a sampling circuit in the third embodiment of the present technology.

FIG. 16 is a circuit diagram illustrating one configuration example of a sampling circuit in the third embodiment of the present technology. The comparator 410 of the third embodiment includes sampling switches 411 and 412, a sampling capacitor 413, a short-circuit switch 415, and an operational amplifier 416. The connection configuration of the circuit thereof is similar to the switched capacitor circuit 250 of the first embodiment except that a switch is not disposed on the output side of the sampling capacitor 413 and the short-circuit switch 415 is disposed instead of the filter capacitor 256.

The short-circuit switch 415 short-circuits the inverting input terminal (−) and the output terminal of the operational amplifier 416 in a case where the sampling clock signal P1 is at a high level. Furthermore, the sampling switch 412 of the third embodiment opens and closes the path between one end of the sampling capacitor 413 and the output of the DAC 430. The configuration causes the comparator 410 (i.e., switched capacitor circuit) to function as a circuit for comparing the amplified signal AMP and the feedback signal FB.

Unlike the case of the delta-sigma ADC 300, charge of the sampling capacitor 413 is held during the hold period. At the time of shift from the hold period to the sampling period, charge caused by the difference between the current input voltage (amplified signal AMP) and the input voltage at the time of the previous sampling is supplied by the preamplifier 210. At this time, non-linear kickback voltage is generated. If current in accordance with the kickback voltage flows through the filter capacitor 213 of the preamplifier 210, the distortion performance deteriorates. Since the magnitude of the kickback voltage is caused by the difference of a voltage value from the previously sampled signal, the characteristics more remarkably deteriorate in a case where the frequency component of the input analog signal AIN is high. In contrast, the cutoff switch 214 disconnects one end of the filter capacitor 213 during the sampling period, so that adverse effects thereof can be reduced, and distortion performance and the like can be improved.

Note that the circuit including the preamplifier 210 and the comparator 410 is one example of the sampling circuit described in the claims. Furthermore, the sampling switch 411 is one example of the first sampling switch described in the claims, and the sampling switch 412 is one example of the second sampling switch described in the claims.

Furthermore, in the third embodiment, the sampling control unit 130 can generate the sampling clock signals P1 and P2 whose high-level periods do not overlap as in the variation.

In this way, according to the third embodiment of the present technology, the switched capacitor circuit compares the amplified signal AMP and the feedback signal FB in the ADC, so that the circuit scale can be reduced compared to the configuration in which the switched capacitor circuit is disposed outside the ADC.

4. Fourth Embodiment

Although the preamplifier 210 inverts and amplifies the analog signal AIN in the above-described first embodiment, the configuration of inversion and amplification may have difficulty in increasing input impedance. The preamplifier of a fourth embodiment is different from that in the first embodiment in that the analog signal AIN is amplified without being inverted.

Figure 17:
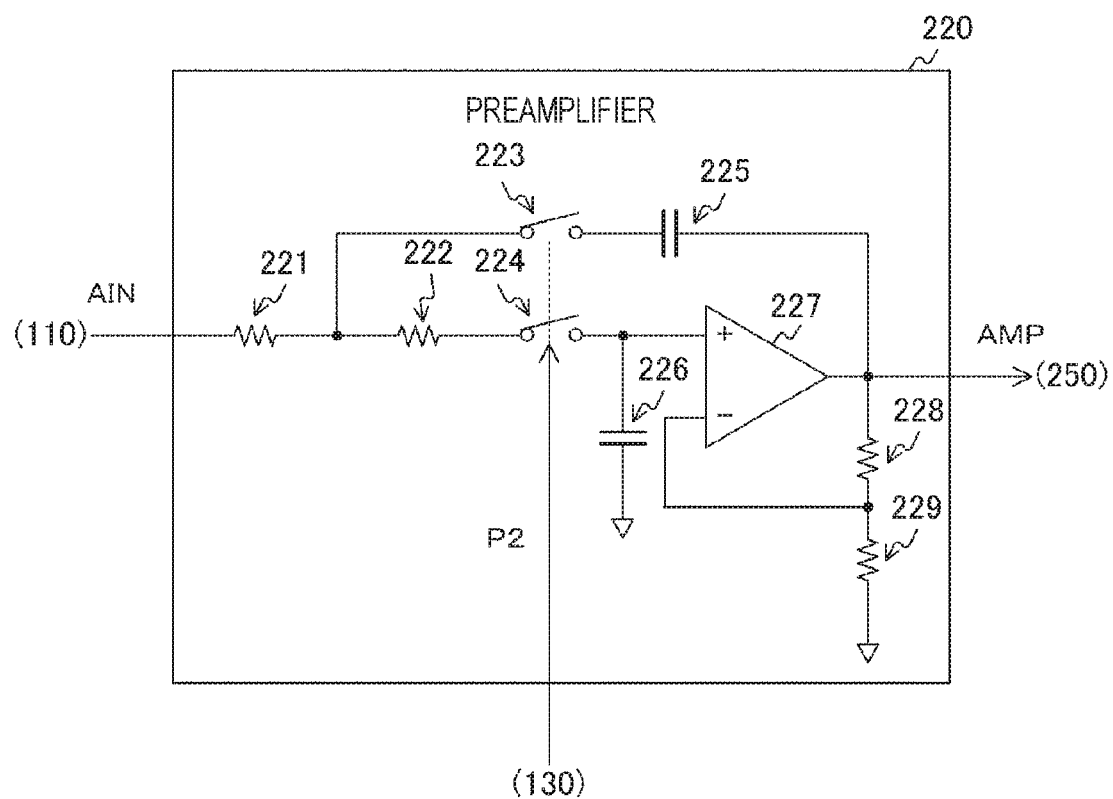
FIG. 17 is a circuit diagram illustrating one configuration example of a preamplifier in a fourth embodiment of the present technology.

FIG. 17 is a circuit diagram illustrating one configuration example of a preamplifier 220 in the fourth embodiment of the present technology. In the fourth embodiment, the preamplifier 220 is disposed instead of the preamplifier 210. The preamplifier 220 includes resistors 221, 222, 228, and 229, cutoff switches 223 and 224, filter capacitors 225 and 226, and an operational amplifier 227.

The resistors 221 and 222 are connected in series. The analog signal AIN is input to one end of the resistor 221. The filter capacitor 225 is inserted between the cutoff switch 223 and an output terminal of the operational amplifier 227. One end of the filter capacitor 226 is connected to the non-inverting input terminal (+) of the operational amplifier 227. The other end is connected to a predetermined reference terminal (e.g., ground terminal). The resistors 228 and 229 are connected in series between the output terminal of the operational amplifier 227 and the reference terminal. The inverting input terminal (−) of the operational amplifier 227 is connected to the connection point of the resistors 228 and 229.

Furthermore, the cutoff switch 223 opens and closes a path between the connection point of the resistors 221 and 222 and one end of the filter capacitor 225 in accordance with the sampling clock signal P2. The cutoff switch 223 shifts to the closed state, for example, in a case where the sampling clock signal P2 is at a high level, and connects the connection point of the resistors 221 and 222 to one end of the filter capacitor 225. In contrast, in a case where the sampling clock signal P2 is at a low level, the cutoff switch 223 shifts to the open state, and disconnects the connection point of the resistors 221 and 222 from one end of the filter capacitor 225.

The cutoff switch 224 opens and closes a path between the resistor 222 and one end of the filter capacitor 226 in accordance with the sampling clock signal P2. The cutoff switch 224 shifts to the closed state, for example, in a case where the sampling clock signal P2 is at a high level, and connects the resistor 222 to the one end of the filter capacitor 226. In contrast, in a case where the sampling clock signal P2 is at a low level, the cutoff switch 224 shifts to the open state, and disconnects the resistor 222 from one end of the filter capacitor 226.

Note that a circuit including the cutoff switches 223 and 224 is one example of a cutoff circuit described in the claims. Furthermore, the cutoff switch 224 is one example of a first cutoff switch described in the claims, and the cutoff switch 223 is one example of a second cutoff switch described in the claims. Furthermore, the filter capacitor 226 is one example of a first filter capacitor described in the claims, and the filter capacitor 225 is one example of a second filter capacitor described in the claims.

The above-described configuration causes the analog signal AIN to be amplified without inversion, and be output as the amplified signal AMP. Furthermore, the preamplifier 220 is a Sallen-Key type low-pass filter, and also functions as a secondary low-pass filter. In the preamplifier 220, the cutoff switches 223 and 224 shift to the open state during the sampling period, so that fluctuation of the amount of charge accumulated in the filter capacitors 225 and 226 can be prevented by disconnecting ends of the filter capacitors 225 and 226.

Note that, although a secondary low-pass filter is provided in the preamplifier 220, a primary low-pass filter can be provided instead. In the case, the resistor 221, the cutoff switch 223, and the filter capacitor 225 are unnecessary.

Furthermore, although the secondary low-pass filter is provided in a non-inverting amplifier circuit, the secondary low-pass filter can be provided in the inverting amplifier circuit (preamplifier 210) of the first embodiment. In the case, a resistor, a cutoff switch, and a filter capacitor are required to be added in the preamplifier 210 one by one, and one end of each of two filter capacitors is required to be disconnected.

Furthermore, in the fourth embodiment, the sampling control unit 130 can generate the sampling clock signals P1 and P2 whose high-level periods do not overlap as in the variation.

Furthermore, in the fourth embodiment, a delta-sigma ADC 300 and a SAR ADC 400 can be disposed in the subsequent stage of the preamplifier 220 as in the second and third embodiments.

In this way, according to the fourth embodiment of the present technology, since a signal is input to the non-inverting input terminal (+) of the operational amplifier 227, the preamplifier 220 can amplify the input signal without inversion. This can easily increase input impedance compared to the case where the input signal is inverted and amplified.

5. Applications

The technology according to the disclosure can be applied to a technology called "Internet of things (IoT)". IoT is a mechanism in which an IoT device 9100 that is a "thing" is connected to other IoT device 9003, the Internet, cloud 9005, and the like, and mutual control is performed by exchanging information. IoT can be used in various industries such as agriculture, home, automobile, manufacturing, distribution, and energy.

Figure 18:
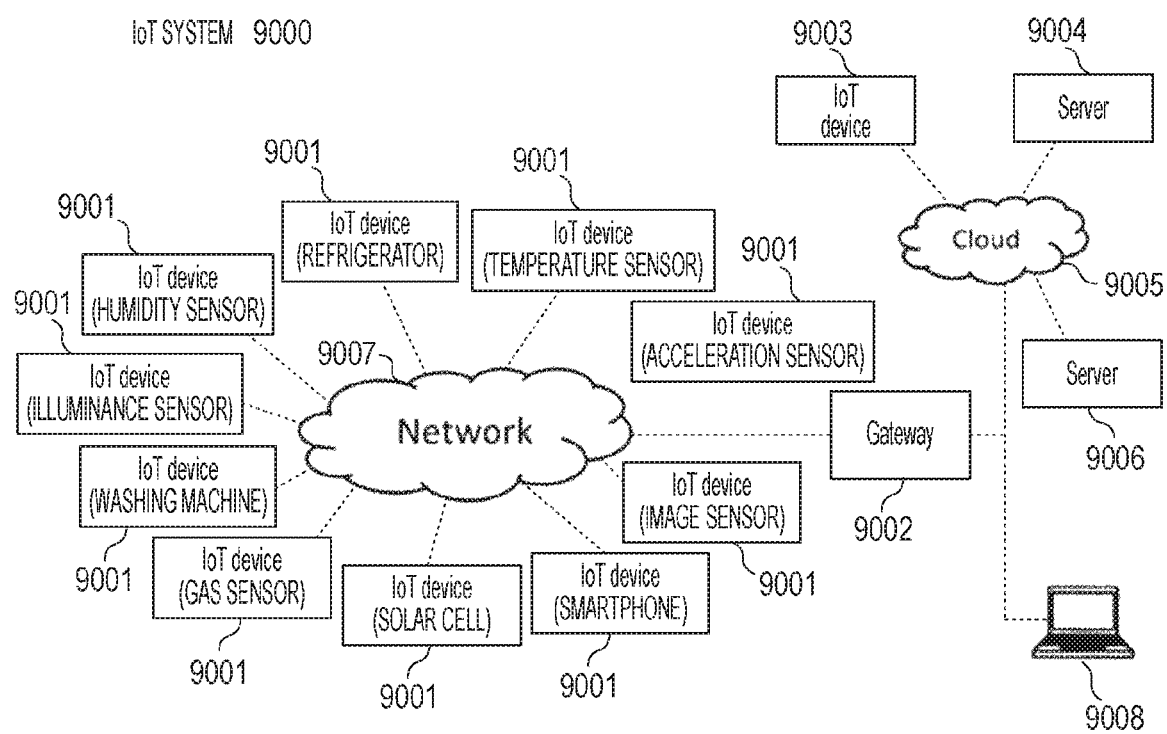
FIG. 18 illustrates one example of the schematic configuration of an IoT system 9000 to which the technology according to the disclosure can be applied.

FIG. 18 illustrates one example of the schematic configuration of an IoT system 9000 to which the technology according to the disclosure can be applied.

The IoT device 9001 includes, for example, various sensors such as a temperature sensor, a humidity sensor, an illuminance sensor, an acceleration sensor, a distance sensor, an image sensor, a gas sensor, and a human sensor. Furthermore, the IoT device 9001 may include a terminal such as a smartphone, a mobile phone, a wearable terminal, and a game device. The IoT device 9001 is powered by, for example, an AC power, a DC power, a battery, contactless power, and so-called energy harvesting. The IoT device 9001 can communicate by, for example, wired, wireless, or proximity wireless communication. A communication system such as 3G/LTE, WiFi, IEEE802.15.4, Bluetooth, Zigbee (registered trademark), and Z-Wave is preferably used. The IoT device 9001 may communicate by switching a plurality of these communication methods.

The IoT device 9001 may form a one-to-one, star, tree, or mesh network. The IoT device 9001 may be connected to the external cloud 9005 directly or through a gateway 9002. An address is given to the IoT device 9001 by, for example, IPv4, IPv6, or 6LoWPAN. Data collected from the IoT device 9001 is transmitted to, for example, other IoT devices 9003, a server 9004, and the cloud 9005. The timing and frequency of the IoT device 9001 transmitting data are preferably adjusted, and the data may be compressed and transmitted. Such data may be used as it is. A computer 9008 may analyze the data by various methods such as statistical analysis, machine learning, data mining, cluster analysis, discriminant analysis, combination analysis, and time series analysis. Using such data enables various services such as control, warning, monitoring, visualization, automation, and optimization.

The technology according to the disclosure can also be applied to devices and services related to homes. IoT device 9001 at home includes, for example, a washing machine, a drying machine, a dryer, a microwave oven, a dishwasher, a refrigerator, an oven, a rice cooker, a cooking utensil, a gas appliance, a fire alarm, a thermostat, an air conditioner, a television, a recorder, an audio, a lighting equipment, a water heater, a hot water heater, a vacuum cleaner, a fan, an air purifier, a security camera, a lock, a door/shutter opening/closing device, a sprinkler, a toilet, a thermometer, a scale, and a blood pressure monitor. The IoT device 9001 may further include a solar cell, a fuel cell, a storage battery, a gas meter, a power meter, and a distribution board.

The IoT device 9001 at home is preferably used in a communication system of a low power consumption type. Furthermore, the IoT device 9001 may communicate by WiFi indoors and by 3G/LTE outdoors. The IoT device 9001 may be controlled by providing an external server 9006 for controlling the IoT device on the cloud 9005. The IoT device 9001 transmits data on, for example, statuses of household devices, temperature, humidity, power usage, and presence/absence of a human/animal inside/outside a house. Data transmitted from a household device is accumulated in the external server 9006 through the cloud 9005. A new service is provided on the basis of such data. The above-described IoT device 9001 can be controlled by voice by using voice recognition technology.

Furthermore, the statuses of various household devices can be visualized by directly sending information from various household devices to a television. Moreover, powers of, for example, an air conditioner and a light can be turned off by various sensors determining presence/absence of a resident and sending data to the air conditioner and the light. Moreover, advertisements can be displayed on displays provided on various household devices through the Internet.

One example of the IoT system 9000, to which the technology according to the disclosure can be applied, has been described above. The technology according to the disclosure can be preferably applied to the IoT device 9001 among the configurations described above. Specifically, the electronic equipment 100 in FIG. 1 can be applied to the IoT device 9001. The signal quality of a sampled signal can be improved by applying the technology according to the disclosure to the IoT device 9001.

Note that the above-described embodiments are examples for embodying the present technology, and the matter in the embodiments and the invention specifying matter in the claims have a corresponding relationship. Similarly, the invention specifying matter in the claims and the matter in the embodiments of the present technology having the same name as this matter have a corresponding relationship. Note, however that the present technology is not limited to the embodiments, and can be embodied by making various modifications to the embodiments without departing from the spirit thereof.

Note that the effects described herein are merely illustrations and not limited, and other effects may be exhibited.

Note that the present technology can also have the configurations as follows.

(1) A sampling circuit including:

an input-side resistor to one end of which an input signal is input;

an operational amplifier that amplifies the input signal, and outputs the input signal from an output terminal as an amplified signal;

a filter capacitor whose one end is connected to an input terminal of the operational amplifier, a predetermined frequency component of the input signal passing through the filter capacitor;

a sampling capacitor that imports the amplified signal during a predetermined sampling period, and holds the amplified signal during a predetermined hold period;

a sampling switch that connects the output terminal of the operational amplifier to one end of the sampling capacitor during the sampling period, and disconnects the output terminal of the operational amplifier from the one end of the sampling capacitor during the hold period; and a cutoff circuit that disconnects the input-side resistor from the one end of the filter capacitor during the sampling period, and connects the input-side resistor to the one end of the filter capacitor during the hold period.

(2) The sampling circuit according to (1), in which the input-side resistor includes a first input-side resistor and a second input-side resistor connected in series, one end of the second input-side resistor is connected to the output terminal of the operational amplifier, the one end of the filter capacitor is connected to an inverting input terminal of the operational amplifier, and another end is connected to the output terminal of the operational amplifier, and the cutoff circuit disconnects a connection point of the first input-side resistor and the second input-side resistor from the one end of the filter capacitor during the sampling period, and connects the connection point to the one end of the filter capacitor during the hold period.

(3) The sampling circuit according to (1), further including a first output-side resistor and a second output-side resistor connected in series between the output terminal of the operational amplifier and a predetermined reference terminal, in which a connection point of the first output-side resistor and the second output-side resistor is connected to an inverting input terminal of the operational amplifier, and the one end of the filter capacitor is connected to a non-inverting input terminal of the operational amplifier.

(4) The sampling circuit according to (3), in which the input-side resistor includes a first input-side resistor and a second input-side resistor connected in series, the filter capacitor includes:

a first filter capacitor whose one end is connected to the non-inverting input terminal of the operational amplifier; and a second filter capacitor whose one end is connected to the output terminal of the operational amplifier, the cutoff circuit includes:

a first cutoff switch that disconnects the input-side resistor from the one end of the first filter capacitor during the sampling period, and connects the input-side resistor to the one end of the first filter capacitor during the hold period; and a second cutoff switch that disconnects a connection point of the first input-side resistor and the second input-side resistor from another end of the second filter capacitor during the sampling period, and connects the connection point to the other end of the second filter capacitor during the hold period.

(5) Electronic equipment including:

an input-side resistor to one end of which an input signal is input;

an operational amplifier that amplifies the input signal, and outputs the input signal from an output terminal as an amplified signal;

a filter capacitor whose one end is connected to an input terminal of the operational amplifier, a predetermined frequency component of the input signal passing through the filter capacitor;

a sampling capacitor that imports the amplified signal during a predetermined sampling period, and holds the amplified signal during a predetermined hold period;

a sampling switch that connects the output terminal of the operational amplifier to one end of the sampling capacitor during the sampling period, and disconnects the output terminal of the operational amplifier from the one end of the sampling capacitor during the hold period;

a cutoff circuit that disconnects the input-side resistor from the one end of the filter capacitor during the sampling period, and connects the input-side resistor to the one end of the filter capacitor during the hold period; and a control unit that controls the sampling switch and the cutoff circuit.

(6) The electronic equipment according to (5), further including:

an integrator that integrates a difference between the amplified signal and a feedback signal, and outputs the difference as a signal to be quantized;

a quantizer that quantizes the signal to be quantized, and outputs the signal as a digital signal; and a digital analog converter that converts the digital signal into an analog signal, and outputs the analog signal as the feedback signal, in which the sampling switch includes:

a first sampling switch that connects the output terminal to one end of the sampling capacitor during the sampling period, and disconnects the output terminal from the one end of the sampling capacitor during the hold period; and a second sampling switch that disconnects the digital analog converter from the one end of the sampling capacitor during the sampling period, and connects the digital analog converter to the one end of the sampling capacitor during the hold period, and the sampling capacitor outputs the difference to the integrator.

(7) The electronic equipment according to (5), further including:

a successive approximation control circuit that updates the feedback signal and generates a digital signal on the basis of a result of comparison between the amplified signal and a feedback signal; and a digital analog converter that generates and outputs the feedback signal under control of the successive approximation control circuit, in which the sampling switch includes:

a first sampling switch that connects the output terminal to one end of the sampling capacitor during the sampling period, and disconnects the output terminal from the one end of the sampling capacitor during the hold period; and a second sampling switch that disconnects the digital analog converter from the one end of the sampling capacitor during the sampling period, and connects the digital analog converter to the one end of the sampling capacitor during the hold period, and the sampling capacitor outputs the result of comparison to the successive approximation control circuit.

(8) The electronic equipment according to any one of (5) to (7), in which the control unit supplies a first sampling clock signal indicating either of the sampling period or the hold period to the sampling switch, and supplies a signal obtained by inverting the first sampling clock signal to the cutoff circuit as a second sampling clock signal.

(9) The electronic equipment according to any one of (5), to (7)

in which the control unit outputs a first sampling clock signal indicating either the sampling period or the hold period to the sampling switch, and supplies a signal, which indicates a period that does not overlap the sampling period as a period for disconnecting the input-side resistor, to the cutoff circuit as the second sampling clock signal.

REFERENCE SIGNS LIST

100 Electronic equipment
110 Analog signal generation unit
120 ADC
130 Sampling control unit
131 Clock signal generation unit
132, 133, 141, 146, 147 Inverter
140 Non-overlap signal generation unit
142, 145 Negative AND (NAND) gate
143, 144 Delay circuit
150 Digital signal processing unit
200 Sampling circuit
210, 220 Preamplifier
211, 212, 221, 222, 228, 229 Resistor
213, 225, 226, 256, 316 Filter capacitor
214, 223, 224 Cutoff switch
215, 227, 257, 317, 416 Operational amplifier
250 Switched capacitor circuit
251, 252, 254, 255, 311, 312, 314, 315, 411, 412 Sampling switch
253, 313, 413 Sampling capacitor
300 Delta-sigma ADC
310 Adder
320 Integrator
330 Quantizer
340, 430 DAC
400 SAR ADC
410 Comparator
415 Short-circuit switch
420 SAR logic circuit
9001 IoT device

The invention claimed is:

1. A sampling circuit, comprising:
an input-side resistor to one end of which an input signal is input;
an operational amplifier configured to:
amplify the input signal, and
output the input signal from an output terminal as an amplified signal;
a filter capacitor whose one end is connected to an input terminal of the operational amplifier, a frequency component of the input signal passing through the filter capacitor;
a sampling capacitor configured to:
import the amplified signal during a sampling period, and
hold the amplified signal during a hold period;
a sampling switch configured to connect the output terminal of the operational amplifier to one end of the sampling capacitor during the sampling period, and disconnects the output terminal of the operational amplifier from the one end of the sampling capacitor during the hold period; and
a cutoff circuit configured to:
disconnect the input-side resistor from the one end of the filter capacitor during the sampling period, and
connect the input-side resistor to the one end of the filter capacitor during the hold period.

2. The sampling circuit according to claim 1,
wherein the input-side resistor includes a first input-side resistor and a second input-side resistor connected in series,
one end of the second input-side resistor is connected to the output terminal of the operational amplifier,
the one end of the filter capacitor is connected to an inverting input terminal of the operational amplifier, and another end is connected to the output terminal of the operational amplifier, and the cutoff circuit is further configured to:
disconnect a connection point of the first input-side resistor and the second input-side resistor from the one end of the filter capacitor during the sampling period, and
connect the connection point to the one end of the filter capacitor during the hold period.

3. The sampling circuit according to claim 1, further comprising:
a first output-side resistor and a second output-side resistor connected in series between the output terminal of the operational amplifier and a reference terminal, wherein
a connection point of the first output-side resistor and the second output-side resistor is connected to an inverting input terminal of the operational amplifier, and
the one end of the filter capacitor is connected to a non-inverting input terminal of the operational amplifier.

4. The sampling circuit according to claim 3, wherein the input-side resistor includes a first input-side resistor and a second input-side resistor connected in series,
the filter capacitor includes:
a first filter capacitor whose one end is connected to the non-inverting input terminal of the operational amplifier; and
a second filter capacitor whose one end is connected to the output terminal of the operational amplifier, and
the cutoff circuit includes:
a first cutoff switch configured to:
disconnect the input-side resistor from the one end of the first filter capacitor during the sampling period, and
connect the input-side resistor to the one end of the first filter capacitor during the hold period; and
a second cutoff switch configured to:
disconnect a connection point of the first input-side resistor and the second input-side resistor from another end of the second filter capacitor during the sampling period, and
connect the connection point to the other end of the second filter capacitor during the hold period.

5. An electronic equipment, comprising:
an input-side resistor to one end of which an input signal is input;
an operational amplifier configured to:
amplify the input signal, and
output the input signal from an output terminal as an amplified signal;
a filter capacitor whose one end is connected to an input terminal of the operational amplifier, a frequency component of the input signal passing through the filter capacitor;
a sampling capacitor configured to:
import the amplified signal during a sampling period, and
hold the amplified signal during a hold period;
a sampling switch configured to:
connect the output terminal of the operational amplifier to one end of the sampling capacitor during the sampling period, and
disconnect the output terminal of the operational amplifier from the one end of the sampling capacitor during the hold period;

a cutoff circuit configured to:
disconnect the input-side resistor from the one end of the filter capacitor during the sampling period, and
connect the input-side resistor to the one end of the filter capacitor during the hold period; and
a control unit configured to control the sampling switch and the cutoff circuit.

6. The electronic equipment according to claim 5, further comprising:
an integrator configured to:
integrate a difference between the amplified signal and a feedback signal, and
output the difference as a signal to be quantized;
a quantizer configured to:
quantize the signal to be quantized, and
output the signal as a digital signal; and
a digital analog converter configured to:
convert the digital signal into an analog signal, and
output the analog signal as the feedback signal, wherein
the sampling switch includes:
a first sampling switch that connects the output terminal to one end of the sampling capacitor during the sampling period, and disconnects the output terminal from the one end of the sampling capacitor during the hold period; and
a second sampling switch that disconnects the digital analog converter from the one end of the sampling capacitor during the sampling period, and connects the digital analog converter to the one end of the sampling capacitor during the hold period, and
the sampling capacitor outputs the difference to the integrator.

7. The electronic equipment according to claim 5, further comprising:
a successive approximation control circuit configured to:
update a feedback signal, and
generate a digital signal on a basis of a result of comparison between the amplified signal and a feedback signal; and
a digital analog converter configured to generate and output the feedback signal under control of the successive approximation control circuit, wherein the sampling switch includes:
a first sampling switch configured to:
connect the output terminal to one end of the sampling capacitor during the sampling period, and
disconnect the output terminal from the one end of the sampling capacitor during the hold period; and
a second sampling switch configured to:
disconnect the digital analog converter from the one end of the sampling capacitor during the sampling period, and
connect the digital analog converter to the one end of the sampling capacitor during the hold period, and
the sampling capacitor is configured to output the result of comparison to the successive approximation control circuit.

8. The electronic equipment according to claim 5, wherein the control unit is further configured to:
supply a first sampling clock signal indicating either of the sampling period or the hold period to the sampling switch, and
supply a signal obtained by inverting the first sampling clock signal to the cutoff circuit as a second sampling clock signal.

9. The electronic equipment according to claim 5, wherein the control unit is further configured to:

output a first sampling clock signal indicating either the sampling period or the hold period to the sampling switch, and supply a signal, which indicates a period that does not overlap the sampling period as a period for disconnecting the input-side resistor, to the cutoff circuit as a second sampling clock signal.

* * * * *